US008847310B1

(12) United States Patent
Korec

(10) Patent No.: US 8,847,310 B1
(45) Date of Patent: Sep. 30, 2014

(54) POWER DEVICE INTEGRATION ON A COMMON SUBSTRATE

(71) Applicant: Azure Silicon LLC, Raleigh, NC (US)

(72) Inventor: Jacek Korec, Sunrise, FL (US)

(73) Assignee: Azure Silicon LLC, Raleigh, NC (US)

( * ) Notice: Subject to any disclaimer, the term of this patent is extended or adjusted under 35 U.S.C. 154(b) by 0 days.

(21) Appl. No.: 14/295,309

(22) Filed: Jun. 3, 2014

Related U.S. Application Data

(63) Continuation-in-part of application No. 13/887,704, filed on May 6, 2013.

(60) Provisional application No. 61/677,660, filed on Jul. 31, 2012.

(51) Int. Cl.
*H01L 29/76* (2006.01)

(52) U.S. Cl.
USPC ..... 257/336; 257/335; 257/343; 257/E21.418

(58) Field of Classification Search
None
See application file for complete search history.

(56) References Cited

U.S. PATENT DOCUMENTS

| | | |
|---|---|---|
| 4,738,936 A | 4/1988 | Rice |
| 5,365,102 A | 11/1994 | Mehrotra et al. |
| 5,378,912 A | 1/1995 | Pein |
| 5,548,150 A | 8/1996 | Omura et al. |
| 5,559,044 A | 9/1996 | Williams et al. |
| 5,869,875 A | 2/1999 | Hebert |
| 6,049,108 A | 4/2000 | Williams et al. |
| 6,078,090 A | 6/2000 | Williams et al. |
| 6,794,719 B2 | 9/2004 | Petruzzello et al. |
| 7,273,771 B2 | 9/2007 | Kinzer |
| 7,282,765 B2 | 10/2007 | Xu et al. |
| 7,420,247 B2 | 9/2008 | Xu et al. |
| 7,576,388 B1 | 8/2009 | Wilson et al. |
| 7,629,645 B2 | 12/2009 | Montanini et al. |
| 7,745,846 B2 | 6/2010 | Korec et al. |
| 7,842,568 B2 | 11/2010 | Anderson et al. |

(Continued)

FOREIGN PATENT DOCUMENTS

JP   H11-103058 A   4/1999

OTHER PUBLICATIONS

Yuanzheng Zhu et al., "Foleded Gate LDMOS Transistor With Low On-Resistance and High Transconductance," IEEE Transactions on Electron Devices, vol. 48, No. 12, pp. 2917-2928, Dec. 2001.

(Continued)

*Primary Examiner* — Dung A. Le
(74) *Attorney, Agent, or Firm* — Otterstedt, Ellenbogen & Kammer, LLP

(57) ABSTRACT

A MOSFET includes an active region formed on an SOI substrate. A buried well is formed in the active region. A drain region having the first conductivity type is formed in the active region and spaced laterally from a source region and the buried well. A body region is formed in the active region between the source and drain regions on the buried well, and a drift region is formed in the active region between the drain and body regions on at least a portion of the buried well. A shielding structure is formed proximate the upper surface of the active region, overlapping a gate. During conduction, the buried well forms a PN junction with the drift region which, in conjunction with the shielding structure, depletes the drift region. The MOSFET is configured to sustain a linear mode of operation of an inversion channel formed under the gate.

21 Claims, 22 Drawing Sheets

(56) References Cited

U.S. PATENT DOCUMENTS

| | | |
|---|---|---|
| 2006/0001110 A1 | 1/2006 | Igarashi |
| 2007/0034942 A1 | 2/2007 | Xu et al. |
| 2009/0179264 A1 | 7/2009 | Korec et al. |
| 2009/0273029 A1 | 11/2009 | Tien et al. |
| 2010/0301413 A1 | 12/2010 | You |
| 2011/0024839 A1 | 2/2011 | Zinn et al. |
| 2011/0127602 A1 | 6/2011 | Mallikarjunaswamy |
| 2012/0032262 A1* | 2/2012 | Toren et al. ............. 257/343 |
| 2012/0273879 A1* | 11/2012 | Mallikarjunaswamy et al. ............. 257/335 |

OTHER PUBLICATIONS

Andrew Marshall et al., "SOI Design: Analog, Memory and Digital Techniques," Chapter 3: Components, Kluwer Academic Publishers, pp. 47-62, 2002.

I-Shan Michael Sun, "Lateral High-Speed Bipolar Transistors on SOI for RF SoC Applications," IEEE Transactions on Electron Devices, vol. 52, No. 7, pp. 1376-1383, Jul. 2005.

Mansun Chan et al., "A High Performance Lateral Bipolar Transistor From a SOI CMOS Process," Proc. 1995 IEEE International SOI Conference, pp. 90-91, Oct. 1995.

Alan Wood et al., "High Performance Silicon LDMOS Technology for 2GHz RF Power Applications," IEEE IEDM 96, RF Semiconductor Division, Semiconductor Product Sector, Motorola, Inc., pp. 87-90, Dec. 1996.

I. Cortes et al., "A Numerical Study of Field Plate Configurations in RF SOI LDMOS Transistors," Sold-State Electronics 50, Elsevier, pp. 58-63, Dec. 2005.

"CMOS SOI Technology," Technical Note, Honeywell Solid State Electronics Center, pp. 1-7, Oct. 2001.

S.B. Goody et al., "A Fully Oxide-Isolated Bipolar Transistor Integrated Circuit Process," Semiconductor Wafer Bonding: Physics and Applications III, ECS Proceedings Series, PV 95-7, pp. 1-11, 1995.

International Search Report and Written Opinion of the International Searching Authority issued in connection with related PCT Application No. PCT/US2013/050700, pp. 1-9, Sep. 30, 2013.

Won-Suk Choi and Dong-Kook Son, "New Generation Super-Junction MOSFETs, SuperFET® II and SuperFET® II Easy Drive MOSFETs for High Efficiency and Lower Switching Noise," Application Note AN-5232, Fairchild Semiconductor Corporation, pp. 1-15, Sep. 2013.

\* cited by examiner

POWER DEVICE INTEGRATION ON A COMMON SUBSTRATE

CROSS-REFERENCE TO RELATED APPLICATION(S)

This patent application is a continuation-in-part of U.S. application Ser. No. 13/887,704 filed on May 6, 2013, entitled "Power Device Integration on a Common Substrate," which claims the benefit of U.S. Provisional Patent Application Ser. No. 61/677,660 filed on Jul. 31, 2012, the disclosures of which are incorporated herein by reference in their entireties for all purposes.

FIELD OF THE INVENTION

The present invention relates generally to electronic circuits, and more particularly relates to power device integration.

BACKGROUND OF THE INVENTION

Modern portable electronic devices, including, but not limited to, smart phones, laptop and tablet computing devices, netbooks, etc., are battery operated and generally require power supply components for stabilizing the supply voltage applied to subsystems in the devices, such as, for example, microprocessors, graphic displays, memory chips, etc. The required power range is often between about 1 watt (W) and about 50 W.

Power supply/management components are usually partitioned into functional blocks; namely, control circuitry, driver stage and power switches. From the standpoint of device miniaturization, which is a desired objective of many portable electronic devices, it is advantageous to integrate the power supply/management components into a single integrated circuit (IC) chip. This solution is particularly dominant in very low power consumption products, where supply current is limited to a few hundreds of milliamperes (mA). FIG. 1 is a block diagram illustrating an exemplary power stage which includes power management control circuitry 102, a driver stage 104, and power switches 106 and 108, all monolithically integrated in a single IC 100.

Typically, metal-oxide-semiconductor field-effect transistor (MOSFET) devices are used to implement the power switches. A MOSFET requires relatively few mask steps to be manufactured (e.g., less than about ten mask levels), whereas control circuitry in the IC usually requires a relatively large number of mask steps (e.g., about 26 to 36 mask levels) in comparison to MOSFET devices. Consequently, an allocation of a large die area to the power switch leads to a high product cost, which is undesirable.

SUMMARY OF THE INVENTION

Embodiments of the invention provide novel semiconductor structure and techniques for facilitating the integration of circuits and/or components (e.g., drivers and power switches) on the same silicon substrate as corresponding control circuitry for implementing a power control device. To accomplish this, embodiments of the invention exploit features of a BiCMOS IC fabrication technology implemented on silicon-on-insulator (SOI) substrates with dielectric lateral isolation.

In accordance with an embodiment of the invention, a semiconductor structure includes at least one radio frequency (RF) MOSFET, the MOSFET comprising a first insulating layer formed on a substrate and an active region having a first conductivity type formed on at least a portion of the first insulating layer. A buried well having a second conductivity type is formed in the active region. A source region having the first conductivity type is formed in the active region proximate an upper surface of the active region, the source region being electrically connected with the buried well. A drain region having the first conductivity type is formed in the active region proximate the upper surface of the active region and spaced laterally from the source region and the buried well. The MOSFET further includes a body region having the second conductivity type formed in the active region between the source and drain regions on at least a portion of the buried well, at least a portion of the source region extending laterally into the body region, and a drift region having the first conductivity type formed in the active region between the drain and body regions on at least a portion of the buried well. A gate is formed above the active region of the MOSFET proximate the upper surface of the active region and at least partially between the source and drain regions. A shielding structure is formed proximate the upper surface of the active region, the shielding structure being spaced laterally from the gate and overlapping at least a portion of the gate, the shielding structure being electrically connected at one end to the source region. During conduction of the MOSFET under a potential applied to the drain region, the MOSFET is configured such that the buried well forms a PN junction with the drift region which, in conjunction with the shielding structure, depletes at least a portion of the drift region between the shielding structure and the buried well. The MOSFET is configured to induce a velocity saturation mode of operation in the depleted drift region when the potential applied to the drain region is larger than an applied gate bias to thereby sustain a linear mode of operation of an inversion channel formed under the gate for all operating conditions of the transistor.

In accordance with another embodiment of the invention, a method of forming an RF MOS transistor adaptable for integration with one or more other components on a common substrate includes: forming a first insulating layer on a substrate; forming an active region having a first conductivity type on at least a portion of the first insulating layer; forming a buried well having a second conductivity type in the active region; forming a source region having the first conductivity type in the active region proximate an upper surface of the active region, the source region being electrically connected with the buried well; forming a drain region having the first conductivity type in the active region proximate the upper surface of the active region and spaced laterally from the source region and the buried well; forming a body region having the second conductivity type in the active region between the source and drain regions on at least a portion of the buried well, at least a portion of the source region extending laterally into the body region; forming a drift region having the first conductivity type in the active region between the drain and body regions on at least a portion of the buried well; forming a gate above the active region proximate the upper surface of the active region and at least partially between the source and drain regions; forming a shielding structure formed proximate the upper surface of the active region, the shielding structure being spaced laterally from the gate and overlapping at least a portion of the gate, the shielding structure being electrically connected at one end to the source region; and configuring the RF MOS transistor such that during conduction under a potential applied to the drain region, the buried well forms a PN junction with the drift region which, in conjunction with the shielding structure, depletes at least a portion of the drift region between the shielding structure and the buried well, wherein the transistor is configured to induce a velocity saturation mode of operation in the depleted drift region when the potential applied to the drain region is larger than an applied gate bias to thereby sustain a linear mode of operation of an inversion channel formed under the gate for all operating conditions of the transistor.

Embodiments of the invention will become apparent from the following detailed description thereof, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein.

Figure 1:
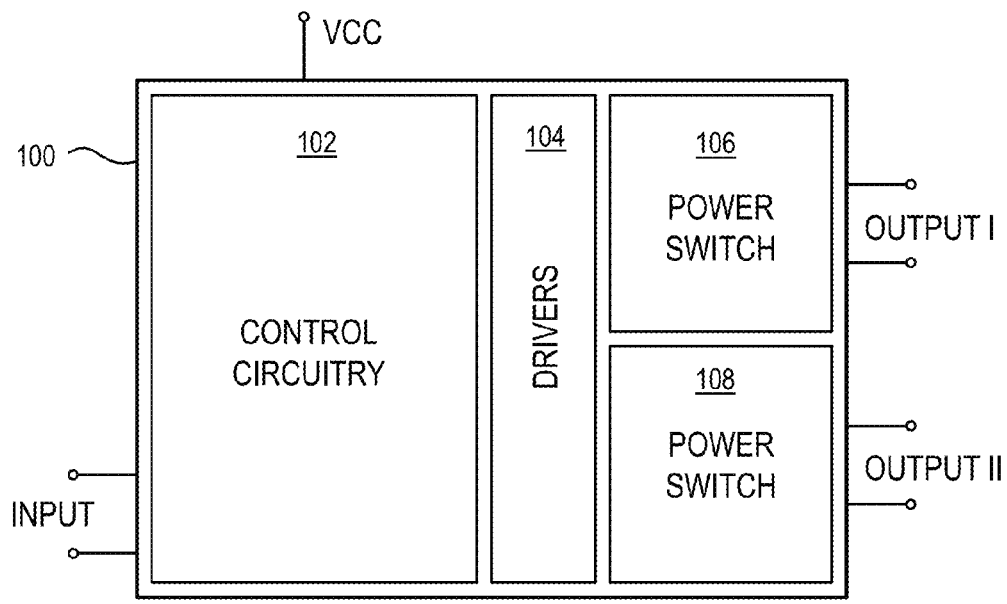
FIG. 1 is a block diagram illustrating an exemplary power management circuit including control circuitry, a driver stage and power switches implemented in a single IC.

It is to be appreciated that elements in the figures are illustrated for simplicity and clarity. Common but well-understood elements that may be useful or necessary in a commercially feasible embodiment may not be shown in order to facilitate a less hindered view of the illustrated embodiments.

DETAILED DESCRIPTION OF PREFERRED EMBODIMENTS

Embodiments of the invention will be described herein in the context of illustrative power management circuits and semiconductor fabrication methods for forming one or more components suitable for use in the illustrative power management circuits. It should be understood, however, that embodiments of the invention are not limited to the particular circuits and/or methods shown and described herein. Rather, embodiments of the invention are more broadly related to techniques for fabricating an integrated circuit in a manner which achieves high-frequency performance for a variety applications, such as, for example, radio frequency (RF) signal amplification, and advantageously reduces the physical size and cost of external components which may be used in conjunction with embodiments of the invention, such as, for example, a DC-DC power supply, an output filter, among other benefits. Moreover, it will become apparent to those skilled in the art given the teachings herein that numerous modifications can be made to the embodiments shown that are within the scope of the claimed invention. That is, no limitations with respect to the embodiments shown and described herein are intended or should be inferred.

For the purpose of describing and claiming aspects of the invention, the term MOSFET as used herein is intended to be construed broadly so as to encompass any type of metal-insulator-semiconductor field-effect transistor (MISFET). The term MOSFET is, for example, intended to encompass semiconductor field-effect transistors that utilize an oxide material as their gate dielectric, as well as those that do not. In addition, despite a reference to the term "metal" in the acronyms MOSFET and MISFET, a MOSFET and/or MISFET according to embodiments of the invention are also intended to encompass semiconductor field-effect transistors having a gate formed from a non-metal, such as, for instance, polysilicon.

Although implementations of the present invention described herein may be implemented using P-channel MISFETs (hereinafter called "PMOS" or "PFET" devices) and N-channel MISFETs (hereinafter called "NMOS" or "NFET" devices), as may be formed using a BiCMOS (bipolar complementary metal-oxide-semiconductor) fabrication process, it is to be appreciated that the invention is not limited to such transistor devices and/or such a fabrication process, and that other suitable devices, such as, for example, laterally diffused metal-oxide-semiconductor (LDMOS) devices, bipolar junction transistors (BJTs), etc., and/or fabrication processes (e.g., bipolar, complementary metal-oxide-semiconductor (CMOS), etc.), may be similarly employed, as will be understood by those skilled in the art given the teachings herein. Moreover, although embodiments of the invention are fabricated in a silicon wafer, embodiments of the invention can alternatively be fabricated on wafers comprising other materials, including but not limited to gallium arsenide (GaAs), gallium nitride (GaN), indium phosphide (InP), cadmium selenide (CdSe), cadmium telluride (CdTe), zinc sulfide (ZnS), etc.

As previously stated, when device current is limited to a few hundreds of milliamperes (i.e., device power consumption less than about two watts), the illustrative power stage can be monolithically integrated in a power management circuit architecture as shown in FIG. 1, wherein the control circuitry 102, driver stage 104 and power switches 106, 108 are all fabricated on the same IC chip 100. However, when device power consumption increases beyond about five watts or so (e.g., greater than about two amperes (A)), an alternative partitioning of the power management circuit is advantageous and/or required.

Figure 2:
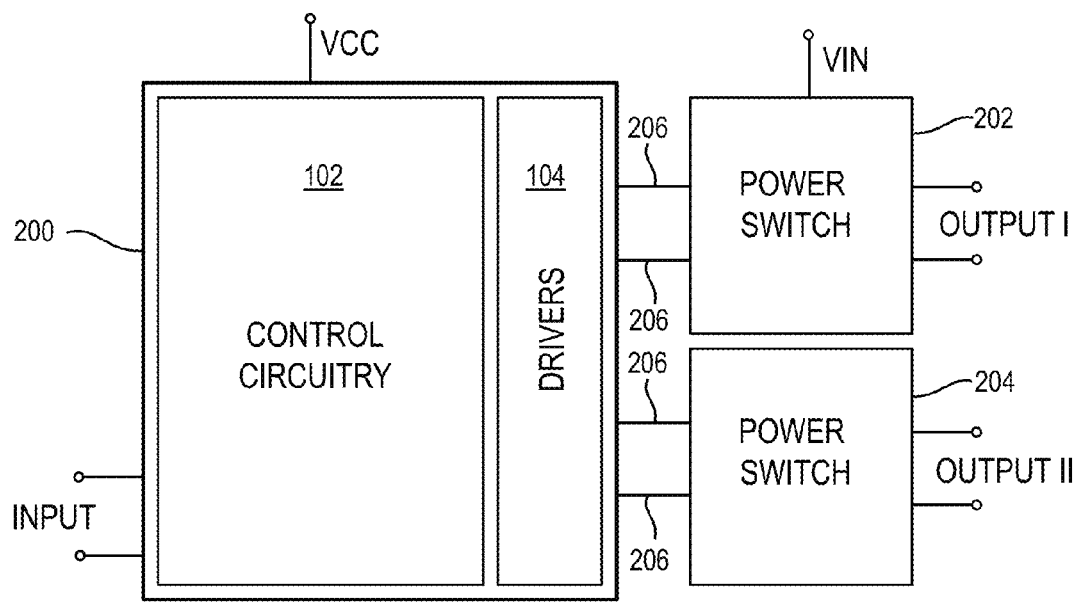
FIG. 2 is a block diagram illustrating a power stage including exemplary power management control circuitry and a driver stage implemented in an IC, coupled with discrete power switches external to the IC.

For example, FIG. 2 is a block diagram illustrating an exemplary power stage comprising power management control circuitry 102 and a driver stage 104 implemented in a first IC 200, and power switches implemented in individually packaged discrete IC devices, 202 and 204, coupled with and external to the first IC. Unfortunately, while this solution enables the control circuitry to be fabricated separately from the power switches, and thus benefit from an ability to individually optimize the fabrication process for each IC, parasitic impedances (primarily parasitic inductance) associated with interconnections 206 (e.g., printed circuit traces, bond wires, ball grid array (BGA), etc.) between the first (control) IC 200 and the power switch ICs 202 and 204, essentially prevent this approach from being used in high-frequency applications (e.g., above about one megahertz). However, this approach is generally used for power conversion in the range of about 5-30 watts.

Figure 3:
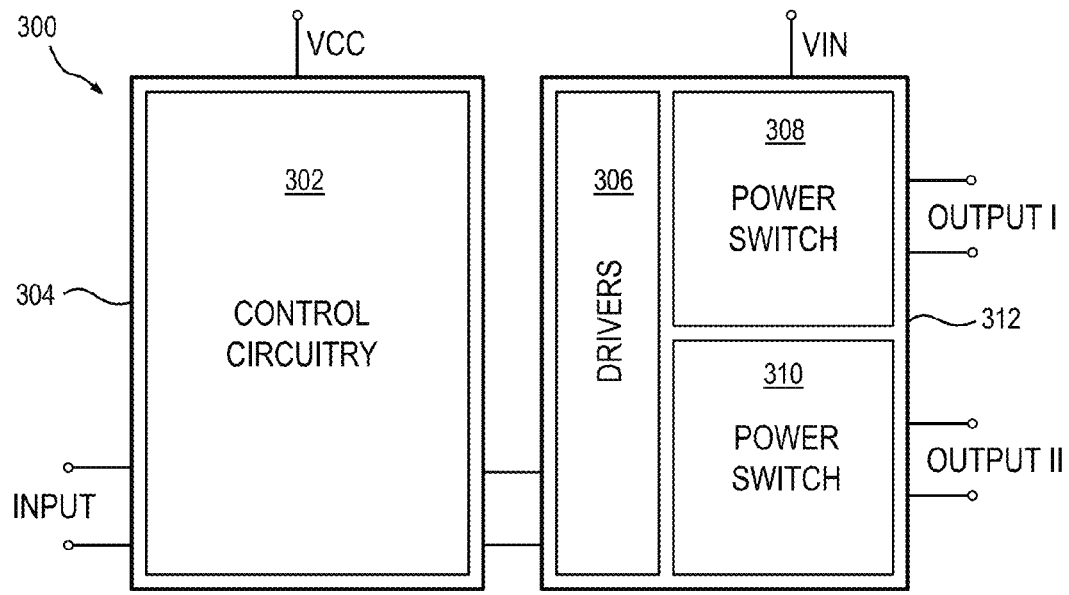
FIG. 3 is a block diagram illustrating a power stage including exemplary power management control circuitry implemented in a first IC, and a driver stage and power switches implemented in a second IC coupled with the first IC, suitable for use in accordance with embodiments of the invention.

FIG. 3 is a block diagram illustrating at least a portion of an exemplary power stage 300 comprising power management control circuitry 302 implemented in a first IC 304, and a driver stage 306 and power switches 308 and 310 implemented in a second IC 312 coupled with the first IC, according to an embodiment of the invention. The partitioning of the power stage 300 as shown in FIG. 3 is applied, for example, to DC-DC converters and other circuits and subsystems with a power conversion larger than about 30 watts. More particularly, the power stage 300 is partitioned into a control IC 304, fabricated in a more complex digital VLSI (very large scale integration) technology process, and a power block 312 implemented as a multi-chip module (MCM) including the driver stage 306, fabricated in an analog technology, and discrete power switches 308 and 310 integrated as bare dies in the MCM.

The MCM approach of FIG. 3 is suitable for power management systems for large power applications. In this case, the module includes three separate dies: a driver chip and two MOSFET power switches. Portable electronics puts a strong demand on miniaturization of the implemented subsystems (i.e., small volume), and on reducing power losses generated in power conversion stages. Thus, aspects of the invention provide a cost-effective technology solution allowing a monolithic integration of driver stages with power switches which enable a two-die solution according to the partition scheme shown in FIG. 3. That is, the driver and FET power switches can be manufactured on the same die for medium power applications needed for battery operated portable electronics. There is presently no technology enabling such system partitioning for a power range higher than about five watts.

Typically, a digital/analog process, such as, for example, a BiCMOS technology, is developed with an aim to maximize integration density and speed of signal processing. Optional power switches which can be designed using existing doping profiles and process steps generally cannot achieve sufficient performance in a power management application. The reduction of transistor on-resistance and the reduction of switching power loss require a dedicated optimization of the doping structure and use of a tailored sequence of process steps. This is usually done in the design of discrete power switches only. On the other hand, the processing of discrete power switches does not allow a monolithic integration of different electronic components, including NFETs, PFETs, bipolar junction transistors, P-N junction and Schottky diodes, etc.

Power management systems (e.g., DC-DC converters) typically use power switches to perform a high-frequency chopping of the input power and use an output filter comprising inductors and capacitors to stabilize the output voltage under variable load conditions. The higher the switching frequency, the better the power conversion performance, and smaller volume and cost of the required output filter. An increase in the switching frequency from about 1 megahertz (MHz) available today to about 5 MHz is desired but has not been achievable due to associated switching power losses in the power transistors used to implement the power switches which are attributable, at least in part, to device parasitic impedances (e.g., internal capacitance, inductance, and resistance).

Figure 4:
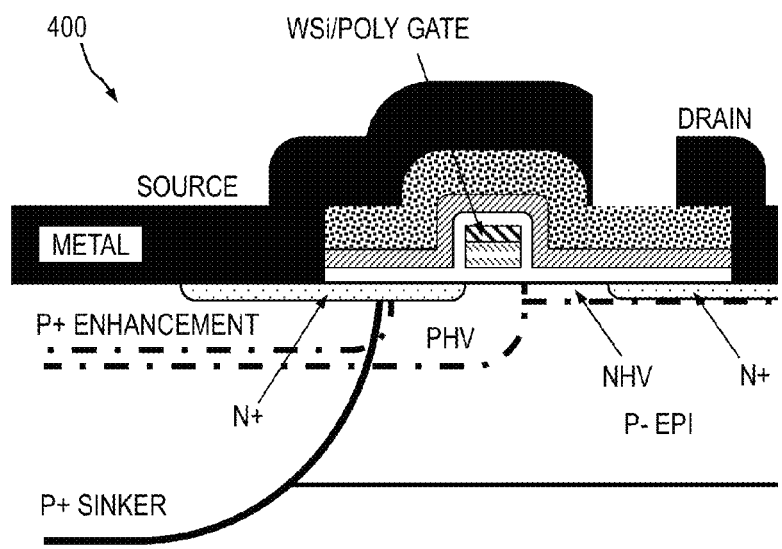
FIGS. 4 and 5 are cross-sectional views depicting conventional laterally diffused metal-oxide-semiconductor (LDMOS) transistor devices.
Figure 5:
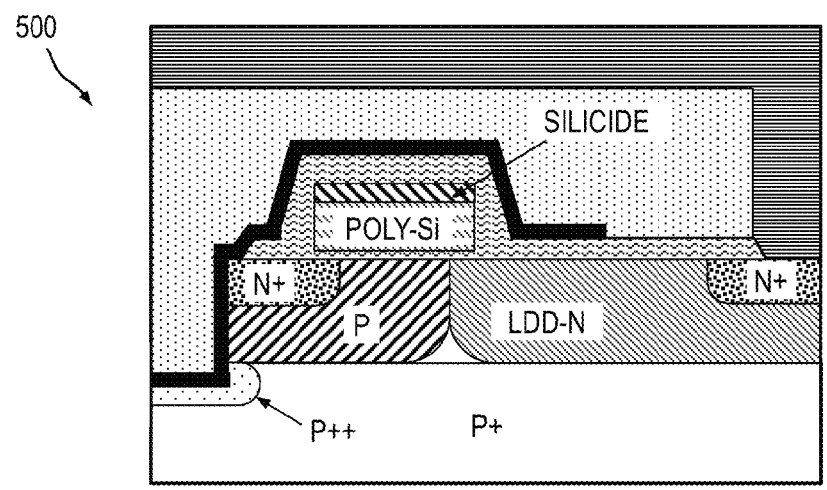
Figure 6:
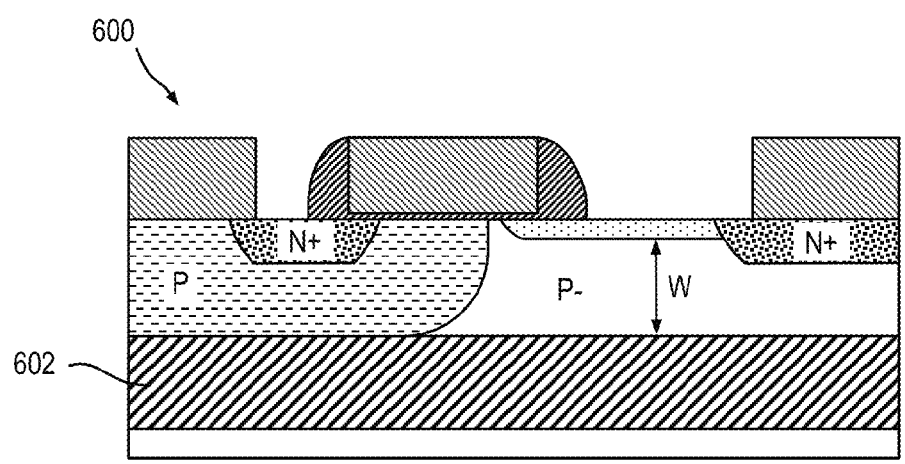
FIGS. 6 and 7 are cross-sectional views depicting conventional LDMOS transistor devices formed on SOI substrates.
Figure 7:
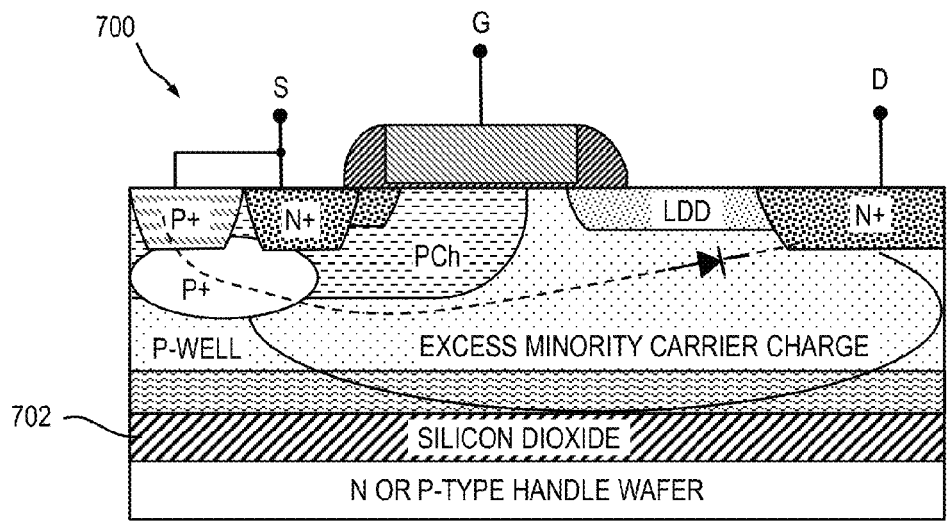

It is known that the switching performance of power MOSFETs can be drastically improved by reducing internal capacitances and the charge stored in an internal body diode (see, e.g., U.S. Pat. Nos. 7,420,247 and 7,842,568). FIGS. 4 and 5 are cross-sectional views depicting discrete laterally diffused metal-oxide-semiconductor (LDMOS) transistors 400 and 500, respectively, known in the art. The design of a power MOSFET on a silicon-on-insulator (SOI) substrate often provides a significant technical advantage in the performance of the MOSFET. FIGS. 6 and 7 are cross-sectional views depicting LDMOS transistors 600 and 700, respectively, formed on SOI substrates that are known in the art. Buried oxide beneath an active SOI layer (e.g., 602 in FIGS. 6 and 702 in FIG. 7) lowers output capacitance ($C_{oss}$) and strongly reduces a body diode volume, thereby reducing a diode stored charge ($Q_{rr}$) and related power loss during commutation (i.e., reversing bias across the transistor), compared to standard device structures. Both features reduce associated switching losses and enable an increase in the operating frequency of the device.

Despite at least these technical advantages of the use of SOI substrates, the proposed transistors have not been widely adapted for manufacturing of discrete and/or integrated power MOSFETs due, at least in part, to an increased cost of the product. Moreover, acceptance of this approach is impeded by problems with long term reliability of the gate oxide, particularly at side corners of the gate, due primarily to hot carrier injection (HCI) under avalanche condition.

Thus, there is a need to develop an analog integration process focused on optimal switching performance of lateral power devices, which allows a monolithic integration of different types of power switches along with the associated driving stages and, optionally, some monitoring and protection functions. Power stages manufactured in accordance with aspects of the invention provide an enhanced power management solution for an input voltage range between about one volt and about ten volts (V), and an output current between about one ampere and about five amperes. Accordingly, the delivered power will cover a range roughly between three watts and 30 watts, although embodiments of the invention are not limited to this or any specific power range.

As will be explained in further detail below, embodiments of the invention described herein are based on a 20-volt BiCMOS technology implemented on SOI substrates with dielectric lateral isolation. The system partitioning presented in FIG. 3 is achieved as a two-die solution, according to embodiments of the invention. A chip-scale assembly (i.e., chip-scale package (CSP) or wafer-level packaging (WLP)) is preferred to avoid volume and cost associated with packaging of individual components. In embodiments of the invention, the higher cost of the power switches is leveraged by a lower cost of integrated drivers, and a strong reduction in volume and cost of filter components achieved by an increase in operating frequency.

Figure 8:
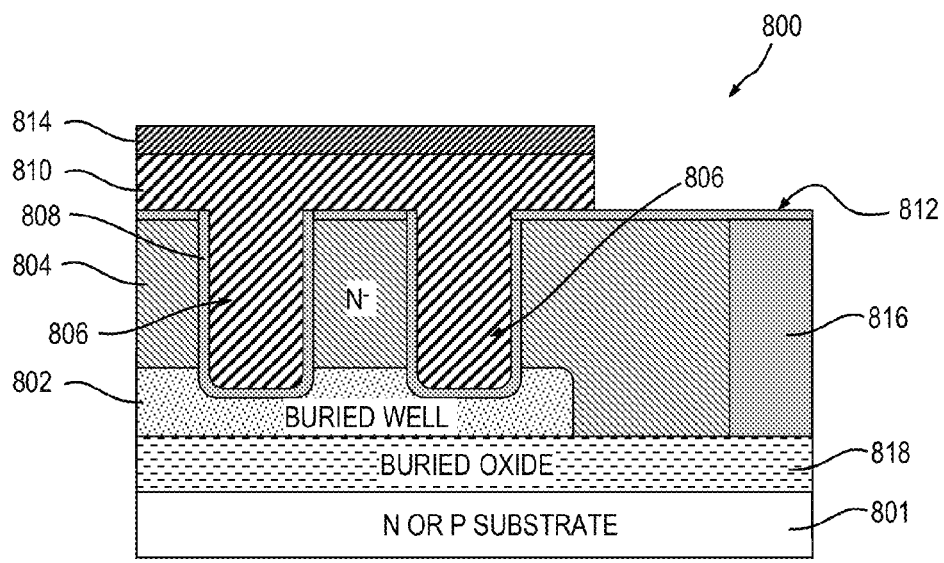
FIG. 8 is a cross-sectional view depicting at least a portion of an exemplary BiCMOS structure, according to an embodiment of the invention.

FIG. 8 is a cross-sectional view depicting at least a portion of an exemplary structure 800 which incorporates aspects according to an embodiment of the invention. The structure 800 may be fabricated using a BiCMOS process technology on an N-type or P-type substrate 801. With reference to FIG. 8, the structure 800 includes a combination of a buried well 802 which is locally implanted at the bottom of an active layer 804 and a plurality of trenches (i.e., trench stripes) 806 having sidewalls and bottom walls lined with gate oxide 808, or an alternative dielectric, and filled with polysilicon material 810, or an alternative conductive material. Trenches 806 are preferably formed as a group of parallel stripes which, when properly biased, affect a current flow therebetween (e.g., in the case of a FET or Schottky diode embodiment), or which function to increase a capacitance per area of the structure (e.g., in the case of a capacitor embodiment). In this example, the active layer 804 is formed as an N⁻ region and the buried well 802 is formed as a P well, although other embodiments may utilize an alternative doping scheme (e.g., N⁻ region and N⁻ buried well, or P⁻ region and P or N buried well), as will become apparent to those skilled in the art given the teachings herein.

The configuration of structure 800 beneficially allows integration of a variety of components, such as, for example, FETs, BJTs, PN diodes, Schottky diodes, resistors and capacitors. Each of the trenches 806 extends substantially vertically from a top surface 812 of the structure 800, through the active layer 804, and at least partially into the buried well 802. In alternative embodiments, the trenches 806 may extend through the buried well 802, into the buried oxide layer 818. The oxide lining 808 covering the sidewalls and bottom walls of the trenches 806 prevents direct electrical connection between the polysilicon material 810 filling the trenches and the buried well 802. Polysilicon fill 810 is preferably used as a gate terminal which can be biased as in, for example, FET and Schottky diode embodiments.

The buried well 802 has an important function in devices operative to sustain an applied blocking voltage, such as transistors or diodes. More particularly, a doping level, doping type and/or a location of the buried well 802 are configured in a manner which substantially pins (i.e., clamps) a breakdown voltage at the PN junction created between an upper right side (i.e., tip) of the buried well and an N⁻ background doping of the active layer 804. By selectively controlling one or more characteristics of the buried well 802, an electric field distribution in the device is controlled.

The trench stripes 806 having walls (i.e., sidewalls and bottom walls) lined with gate oxide 808 are placed between main terminals of the power devices formed therein. The term "main terminals" as used herein is intended to broadly refer to external connections to the device, such as, for example, source and drain terminals, in the case of an MOS device, or anode and cathode terminals, in the case of a diode. The trench gates stripes 806 are formed (e.g., etched) substantially in parallel to a current path in the illustrative embodiment shown in FIG. 8. As a result, a conduction current flows in the N⁻ active layer 804 between the gate trenches 806 and can be controlled (e.g., modulated) by an applied gate potential, in the case of, for example, a lateral Schottky diode. In the case of a FET structure formed in accordance with one or more embodiments of the invention, the trench gates 806 are operative to deplete or enhance a gate/body interface, controlling the current flow through an inversion channel formed in the device.

Doped polysilicon material 810 filling the trenches is used to create a gate bus connecting the gate regions to a gate terminal in a third dimension (not explicitly shown). For an NFET device formed according to an embodiment of the invention, the polysilicon material 810 is preferably doped with phosphorous, with a doping concentration of greater than about $10^{19}/cm^3$, while for a PFET device, the polysilicon material is preferably doped with boron having a doping concentration of about $10^{19}/cm^3$. The top surface of polysilicon gate layer 810 is shown optionally covered by a layer of silicide material 814 (e.g., titanium silicide (TiSi) or tungsten silicide (WSi)) with low resistivity, which can be deposited thereon using a known silicide deposition process (e.g., chemical vapor deposition (CVD), sputter deposition, etc.). The silicide layer 814, which forms a polycide electrode in the device 800, reduces a gate resistance of the device.

In a preferred embodiment, narrow gate trenches 806 are formed underneath the polycide electrode 814 along a path of current flow in the body region 804. In this manner, the trenches 806 increase an effective gate width in the MOSFET structure 800, among other advantages.

Another trench structure 816, formed deeper than trenches 806, is preferably used to create a lateral isolation region between integrated components. The deep trench structure 816, also referred to herein as a lateral isolation trench, can be formed, for example, by etching from the top surface 812 of the structure, through the active layer 804, to a buried oxide layer 818 formed on the substrate 801. The lateral isolation trench 816 can be filled with oxide, or a combination of oxide and polysilicon. An optional deep trench cut (i.e., etch), not explicitly shown, through the buried oxide layer 818 to the substrate 801 can be used as a substrate contact. This optional trench is preferably filled with doped polysilicon, or an alternative conductive material, to ensure good ohmic (i.e., low resistance) contact to the substrate 801.

A variety of electronic components can be created using an illustrative BiCMOS process flow, according to embodiments of the invention. Examples of some components which can be formed which incorporate aspects of the invention are described herein below with reference to FIGS. 9A through 19.

Figure 9A:
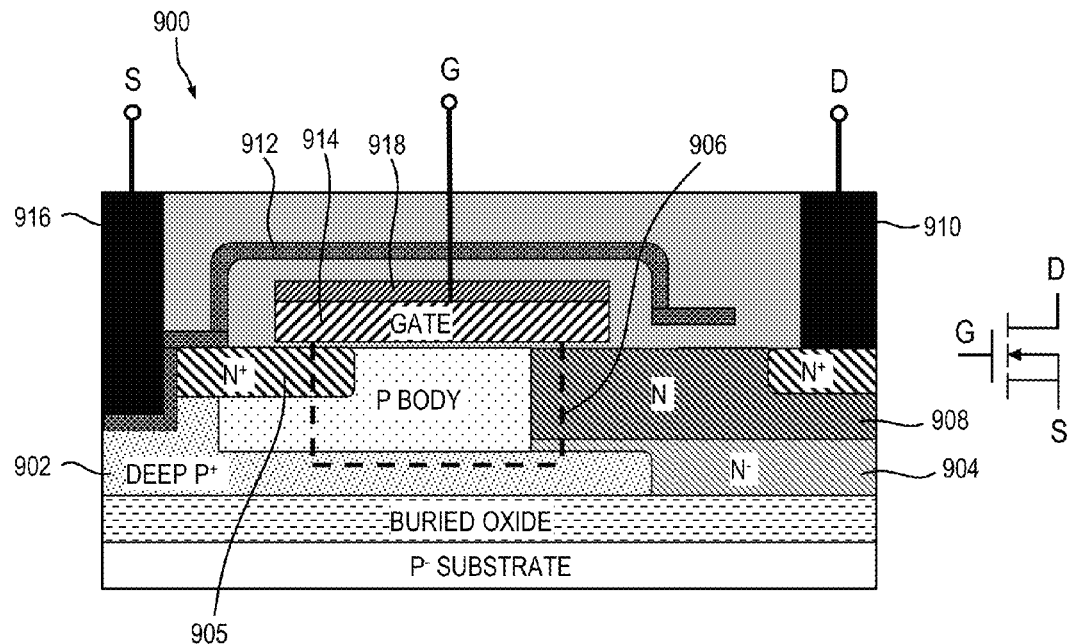
FIGS. 9A and 9B are cross-sectional views depicting at least a portion of an exemplary N-channel LDMOS transistor, according to an embodiment of the invention.
Figure 9B:
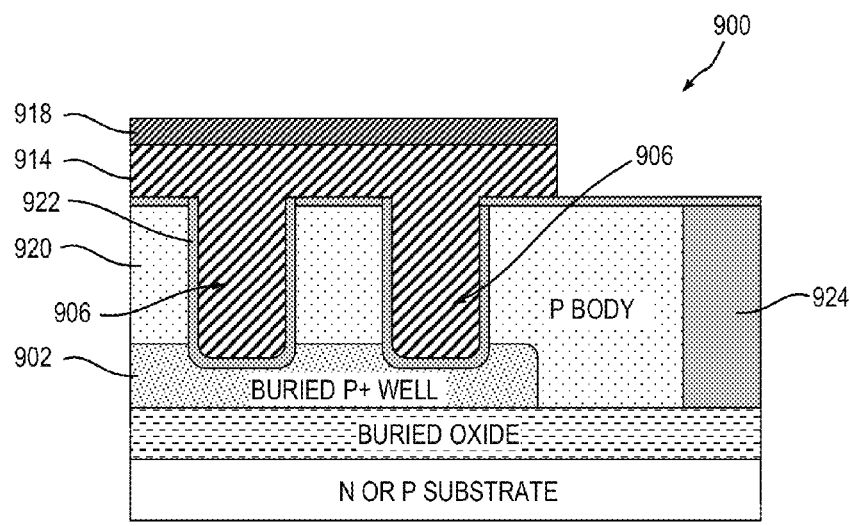

FIG. 9A is a cross-sectional view depicting at least a portion of an exemplary N-channel LDMOS transistor 900, according to an embodiment of the invention. The LDMOS transistor 900 has reduced gate-to-drain capacitance ($C_{gd}$) in comparison to standard LDMOS devices, due at least in part to the effect of the gate shield layer. Moreover, LDMOS transistor 900 shows a small impact of the reverse recovery of the body diode ($Q_{rr}$) due at least in part to reduced diode stored charge. Transistor 900 includes an integrated PN clamping diode pinning the avalanche breakdown close to the upper right corner of a buried P well 902. A conduction current flows from a source region 905 between walls of a trench gate 906 into a lightly doped drain (LDD) extension region 908 into a drain contact 910. An alternative view of a similarly-formed trench gate (with the cross-section taken through the trench) is shown as structure 906 depicted in FIG. 9B. FIG. 9B illustrates the trench gate 906 formed substantially vertically through a P-type body region 920 and into the buried P well 902 formed at the bottom of the body region. The trench gate 906 has walls (i.e., sidewalls and bottom walls) lined with gate oxide 922. Also shown in FIG. 9B is a lateral isolation structure 924, which may be formed in manner consistent with the lateral isolation structure 816 shown in FIG. 8, that provides isolation between integrated components. During processing, a P⁻ handle wafer in SOI substrate gets depleted along a P⁻ substrate/buried oxide interface, which reduces an output capacitance, $C_{oss}$, of the MOSFET.

It is to be appreciated that, in the case of a simple MOS device, because the MOS device is symmetrical in nature, and thus bidirectional, the assignment of source and drain designations in the MOS device is essentially arbitrary. Therefore, the source and drain regions may be referred to generally as first and second source/drain regions, respectively, where "source/drain" in this context denotes a source region or a drain region. In an LDMOS device, which is generally not bidirectional, such source and drain designations may not be arbitrarily assigned.

The buried well 902, like the buried well 802 shown in FIG. 8, has an important function, especially in devices operative to sustain an applied blocking voltage (e.g., transistors and diodes). More particularly, a doping level, doping type and/or a location of the buried well 902 are configured in a manner which substantially clamps the breakdown voltage at the PN junction formed between an upper right side of the buried well and an N⁻ background doping of an active layer 904 in the device. By selectively controlling one or more characteristics of the buried well 902, an electric field distribution in the device is controlled. For instance, the device can be advantageously arranged such that a maximum electric field is distributed between the upper right corner of the buried well 902 and a right bottom corner of a drain contact region 910. When configured in this manner, a clamping PN diode is integrated within the device which keeps hot carriers, generated by avalanche impact ionization, far away from a top silicon/oxide interface. This feature increases an ability of the device to absorb avalanche energy without creating reliability issues in the device.

When the illustrative SOI LDMOS devices 600 and 700 shown in FIGS. 6 and 7, respectively, are pushed into avalanche, impact ionization will take place at a bottom corner of the gate covering a lightly doped drain (LDD) region in the device, and the injection of hot carriers into a gate oxide in the device will often result in reliability issues, as are known to those skilled in the art. For at least this reason, conventional LDMOS structures on SOI are not suitable for use as power switches. By providing an ability to clamp the avalanche at a desired location in an LDMOS transistor device, the LDMOS structure formed in accordance with one or more aspects of the invention is well-suited for use in a power switching application.

With continued reference to FIGS. 9A and 9B, LDMOS transistor 900 includes a shield field plate 912, or alternative shielding structure, which, in this embodiment, is formed as a lateral extension of a conductive layer lining the source trench contact walls, overlaps a gate (e.g., polysilicon structure) 914 and comes into close proximity with an oxide interface along the N drain extension region (i.e., LDD region) 908. The conductive layer is preferably deposited as a titanium (Ti)/titanium nitride (TiN) stack, but may be also formed of other materials, such as, for example, a titanium (Ti)/tungsten silicide (WSi) film. In this illustrative embodiment, the source trench is formed on the left-hand side of the LDMOS transistor 900, having side walls and a bottom wall lined with gate shield layer 912 and filled with top metal.

The shield 912 functions primarily as a field plate, distributing (e.g., stretching) an electric field distribution along a top oxide interface away from an edge (e.g., bottom right corner) of the gate 914 nearest the drain, and helps to reduce gate-to-drain capacitance, $C_{gd}$ (a component of Miller capacitance seen at a gate terminal of a transistor which affects the switching speed of the transistor), at a positive bias of the drain. As a result of the shield 912, the peak electric field present at the drain side corner of the gate 914 will be split between the gate corner and the end of the field plate, thereby reducing the peak electric field value and inhibiting early injection of hot carriers into the gate oxide. Drain and source contacts 910 and 916, respectively, are formed as metal-filled vias reaching a patterned top metal layer (not explicitly shown, but implied) and form drain (D) and source (S) terminals, respectively, of the LDMOS device 900. Depleting the LDD extension region 908, with a positive bias applied to the drain contact 910, also helps reduce the gate-to-drain capacitance $C_{gd}$. A silicide layer 918 formed on the polysilicon gate structure 914, thereby forming a polycide layer (also referred to as silicided polysilicon), is used to create a gate bus leading to a gate terminal (G) located in a third dimension (not explicitly shown, but implied). The silicide layer 918 is preferably formed using a known deposition process (e.g., CVD, sputtering, etc.).

Figure 10A:
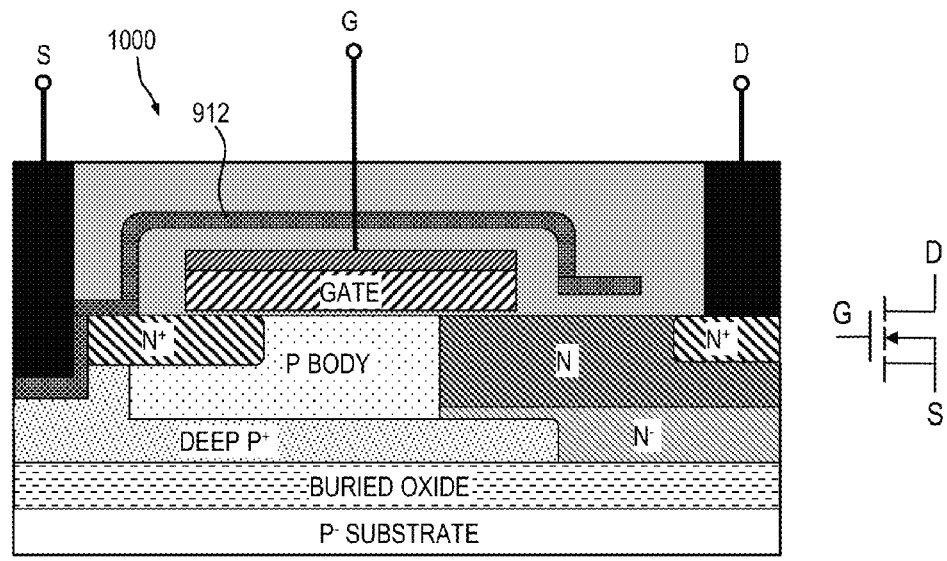
FIG. 10A is a cross-sectional view depicting at least a portion of an exemplary N-channel LDMOS transistor, according to another embodiment of the invention.

FIG. 10A is a cross-sectional view depicting at least a portion of an exemplary N-channel LDMOS transistor 1000, according to another embodiment of the invention. This LDMOS transistor 1000 is designed as a simplification of the LDMOS device 900 shown in FIGS. 9A and 9B. As apparent from FIG. 10A, one simplification in the fabrication of LDMOS device 1000, compared to LDMOS device 900 shown in FIGS. 9A and 9B, comprises removal of the gate trenches (906 in FIGS. 9A and 9B). A primary impact on the performance of the MOSFET 1000 is a smaller gate width per unit area, which increases on-resistance, $R_{ON}$, of the resulting device. This can be leveraged by making the channel length shorter, as the alignment restriction related to an overlap of the gate polysilicon over gate trench endings is removed. Other features and characteristics of the MOSFET device 1000 remain essentially the same as for LDMOS device 900.

Figure 10B:
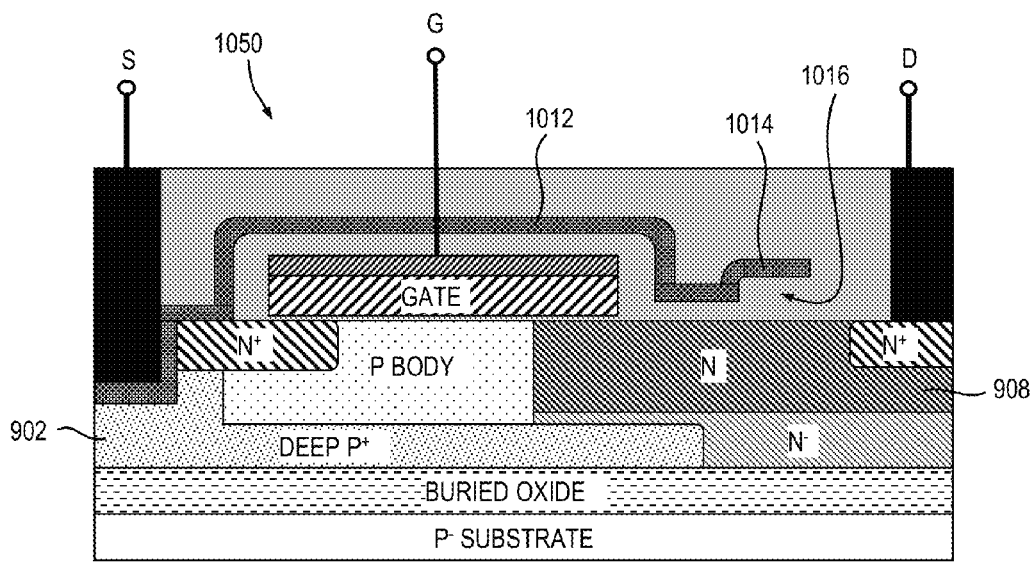
FIG. 10B is a cross-sectional view depicting at least a portion of an exemplary N-channel LDMOS transistor having a stepped field plate structure, according to another embodiment of the invention.

FIG. 10B is a cross-sectional view depicting an alternative embodiment of the exemplary LDMOS transistor 1000 shown in FIG. 10A. Specifically, with reference to FIG. 10B, an exemplary N-channel LDMOS transistor 1050 includes a gate shield 1012 which is modified compared to the gate shield 912 of the LDMOS transistor 1000 shown in FIG. 10A to extend the breakdown voltage of the transistor to above about 20 volts. In the LDMOS transistor 1050 of FIG. 10B, a narrow stripe of thicker oxide 1016 is introduced between the gate and drain terminals. This stripe of thicker oxide 1016 allows the gate shield 1012 to form a multiple-step field plate contour (i.e., raised step portion 1014 is added), which further distributes the peak electric field away from the gate oxide near the drain side corner of the gate.

It is to be understood that by careful design of one or more of the gate, the shield/field plate 912 and the deep P well 902, the electric field in the vicinity of the gate and drain regions of the device can be effectively controlled as desired. This is particularly beneficial for forming a device (e.g., a radio frequency (RF) power transistor) suitable for use, for example, in a power amplifier application. In one or more embodiments of the invention, the LDD doping and thickness, the width of a spacer at the gate side wall (the oxide along the gate wall is thicker than underneath the field plate), the thickness of the oxide underneath the field plate, and/or the extension of the deep P region 902, among other parameters, are configured so that an effective pinching of the electric field in the LDD region adjacent to the gate is achieved. Pinching of the electric field is considered "effective," according to one or more embodiments, when an electric potential of the drain does not affect the long-channel behavior of the MOS structure under the gate; i.e., the electric field within the inversion MOS channel is effectively decoupled from the electric field in the drift region LDD. As will be known by those skilled in the art, in a long-channel MOS device, there is no drain voltage dependence of the current once the drain voltage exceeds a prescribed threshold voltage, $V_T$, of the device (i.e., $V_{DS} \gg V_T$), but as channel length is reduced, drain-induced barrier lowering introduces drain voltage dependence that depends in a complex way upon the device geometry (e.g., channel doping, junction doping, etc.).

By way of example only and without limitation, in one or more embodiments, values of the device structure parameters, for an exemplary RF LDMOS transistor in a voltage range of about 12 to 60 volts, are as follows:

maximum doping concentration in the LDD drift region is between about 1e17 atoms/cm$^3$ and 4e17 atoms/cm$^3$ depth of LDD drift region is between about 0.2 µm and 0.4 µm spacer width at the gate side wall is between about 600 Å and 800 Å thickness of the oxide underneath the field plate over at least a portion of the drift region is between about 800 Å and 1200 Å extension of the deep P well beyond the gate edge on the drain side of the mask layout is between about 0.1 µm and 0.2 µm, where a sheet charge in the deep P well has a value larger than a sheet charge in the drift region. Here, sheet charge can be determined as mean doping concentration of the region multiplied by a thickness of the region; sheet charge is also referred to as charge density. Due to lateral diffusion, this extension will grow further under the drift region.

design of a stack comprising the deep P well, N-LDD drift region, and a contour of the field plate structure is configured to satisfy a prescribed charge balance design rule requiring the charge in the deep P well to be sufficient to compensate a charge in the drift region (see, e.g., Fairchild Semiconductor Corporation Application Note AN-5232, entitled "New Generation Super-Junction MOSFETs, SuperFET® II and SuperFET® II Easy Drive MOSFETs for High Efficiency and Lower Switching Noise," the disclosure of which is incorporated herein by reference in its entirety for all purposes). That is, the buried well, drift region, and the contour of the field plate structure are configured such that a net charge associated with the drift region is substantially balanced with a net charge associated with the deep P well (i.e., charge balancing). As a result, the drift region will be depleted by the PN junction formed by the deep well, in conjunction with the electrostatic impact of the field plate, even under a small positive drain bias. At a drain bias larger than the gate bias, the current flow through the depleted drift region is governed by a velocity saturation of the carriers.

Figure 11:
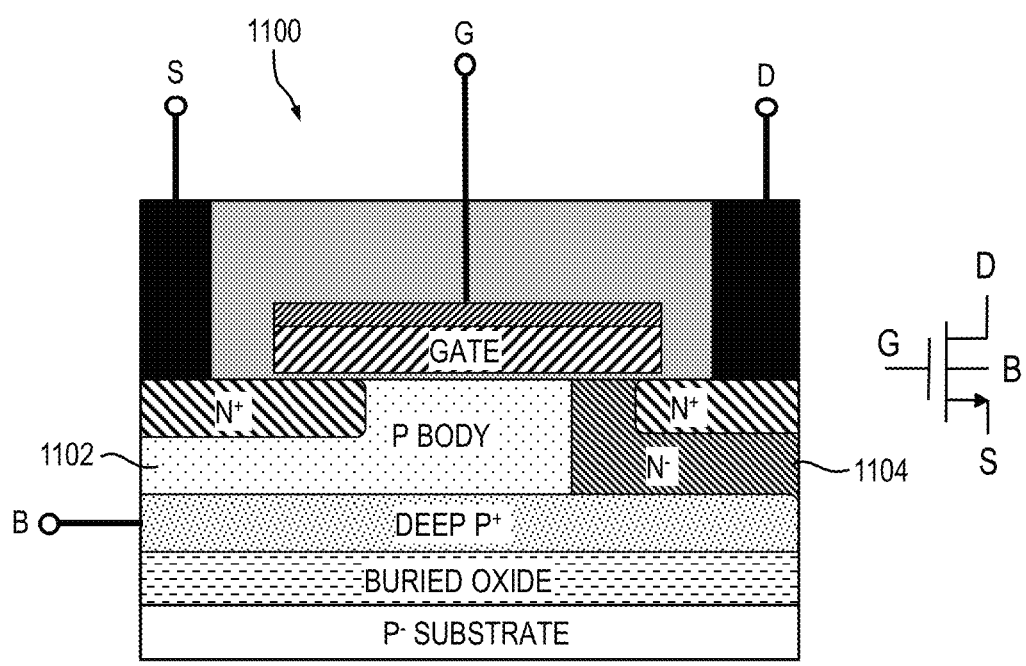
FIG. 11 is a cross-sectional view depicting at least a portion of an exemplary low voltage signal MOSFET, according to an embodiment of the invention.

FIG. 11 is a cross-sectional view depicting at least a portion of an exemplary voltage signal MOSFET 1100, according to an alternative embodiment of the invention. The MOSFET 1100 includes a P body region 1102 and an N drain region 1104, which can be used to form other circuit components, as will be described in further detail below. In this embodiment, the P buried well is not directly connected with the source terminal, as it is in the exemplary MOSFET 1000 shown in FIG. 10A, but rather is connected with a separate bulk (B) terminal. This configuration allows a voltage potential to be applied to the buried well that is different from the voltage potential applied to the source terminal. The MOSFET 1100 is formed by a further simplification of the illustrative device 1000 shown in FIG. 10A. Specifically, a pitch of the basic cell has been reduced, thereby allowing a higher density of such devices to be placed in the circuit. As a trade-off for higher density, MOSFET 1100 has reduced high-voltage capability and reduced avalanche ruggedness, but these features are generally more important for power switching applications.

In certain embodiments of the MOSFET described above in connection with FIGS. 9A through 11, the transistor is designed to a target breakdown voltage specification between about 12 volts and 60 volts. These MOSFET devices are optimized for application as power switches with minimized conduction and switching power losses in low voltage power management systems. Embodiments described herein achieve an increase of the switching frequency of DC-DC converts from about 1.5 MHz to 5 MHz while implementing the integrated scheme shown in FIG. 3. Similarly, in an RF power amplifier application, a MOSFET configured according to embodiments of the invention is optimized for maximum linearity of the drain current, $I_{DS}$, (gate-to-source voltage, $V_{GS}$) transfer curve, and for minimum internal capacitances (e.g., $C_{iss}$, $C_{rss}$, $C_{oss}$), as will be described in further detail herein below.

Figure 12A:
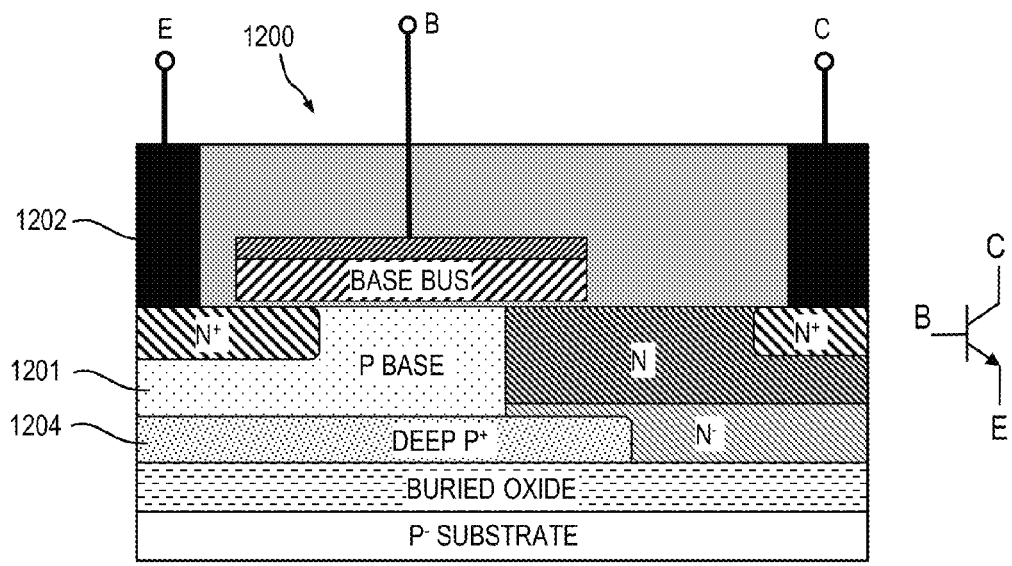
FIGS. 12A and 12B are cross-sectional views depicting at least a portion of an exemplary bipolar junction transistor (BJT), according to embodiments of the invention.
Figure 12B:
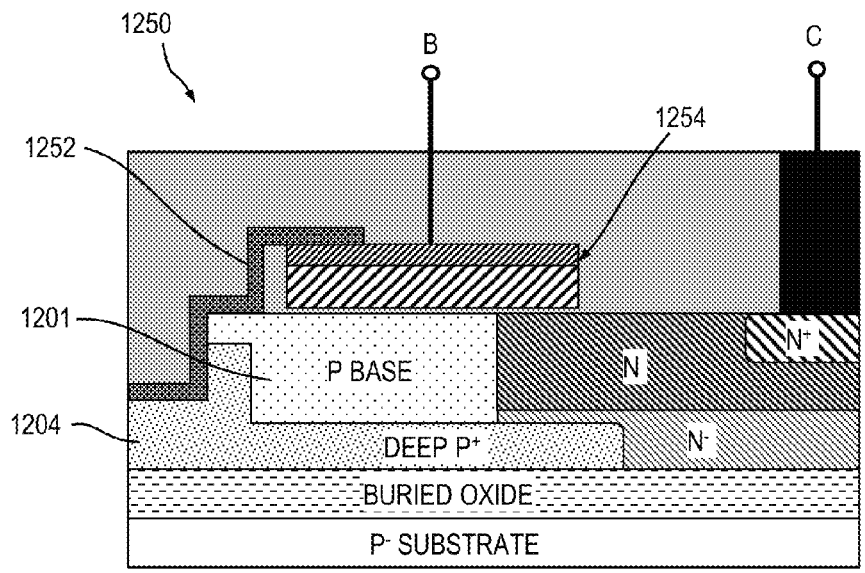

With reference now to FIG. 12A, a cross-sectional view depicts at least a portion of an exemplary bipolar junction transistor (BJT) 1200, according to an embodiment of the invention. BJT 1200 is formed as a modification of the MOSFET device 1000 shown in FIG. 10. Here, a former body region 1102 of the MOSFET 1100 shown in FIG. 11 is used as a base region 1201 of the BJT 1200. The source trench contact has been removed. Instead, trench contacts 1202 are cut across the base region 1201 to make a connection between a deep P layer 1204 and the polycide structure (i.e., silicided polysilicon). FIG. 12B depicts an exemplary BJT 1250 illustrating one way to form the connection between the deep P layer 1204 and the polycide structure, according to an embodiment of the invention. Specifically, a connection 1252 between the deep P layer 1204 and the polycide structure 1254 is formed as small spots (i.e., contacts) by interrupting the emitter contact 1202 (e.g., between fingers) along the finger layout. The connection 1252, in this embodiment, is formed as a lateral extension of the titanium (Ti)/titanium nitride (TiN) layer (in a manner similar to the field plate 912 shown in FIG. 9) and overlaps the polycide structure 1254. These contacts are preferably placed at prescribed intervals along the polycide stripe (e.g., the polycide region which, in the case of a MOSFET, would be the gate patterned as a stripe, and is used to build a base bus contact), and the polycide layer is used to create a base bus with low resistivity. Using the polycide material as a current bus contacting the base region to the base terminal assures low base resistance, which improves switching performance. The initial high-voltage capability and the avalanche ruggedness of the MOSFET structure are preserved using this configuration.

Figure 13:
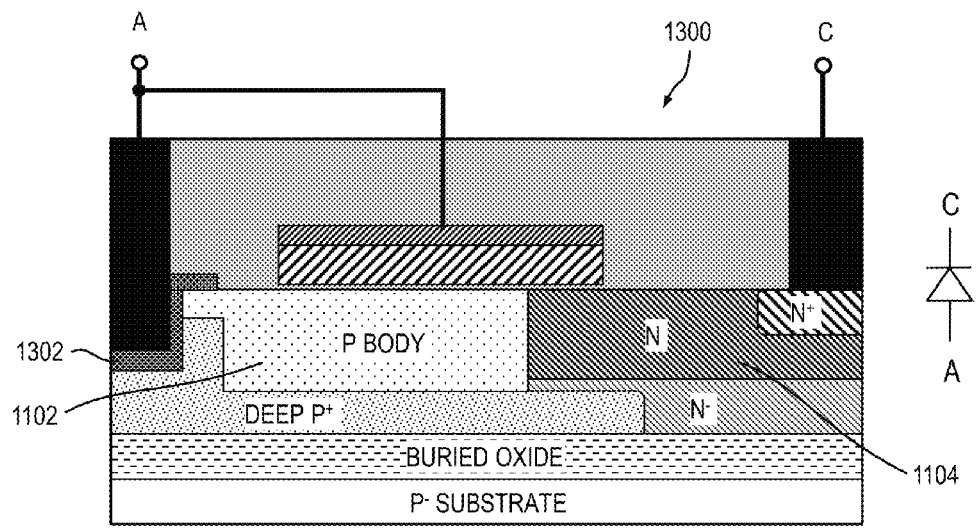
FIG. 13 is a cross-sectional view depicting at least a portion of an exemplary PN diode, according to an embodiment of the invention.

FIG. 13 is a cross-sectional view depicting at least a portion of an exemplary PN diode 1300, according to an embodiment of the invention. The PN diode 1300 is obtained as a modification of the exemplary MOSFET structure 1000 shown in FIG. 10. Here, the source region has been omitted, and the PN junction used to form the diode 1300 is created by a junction of the former P body 1102 and N drain 1104. An anode (A) terminal is formed having a trench contact 1302 adapted for electrical connection with the P body 1102. A cathode (C) terminal is adapted to provide electrical connection with N region 1104 of the diode. The initial high-voltage capability and the avalanche ruggedness of the MOSFET structure are preserved.

Figure 14A:
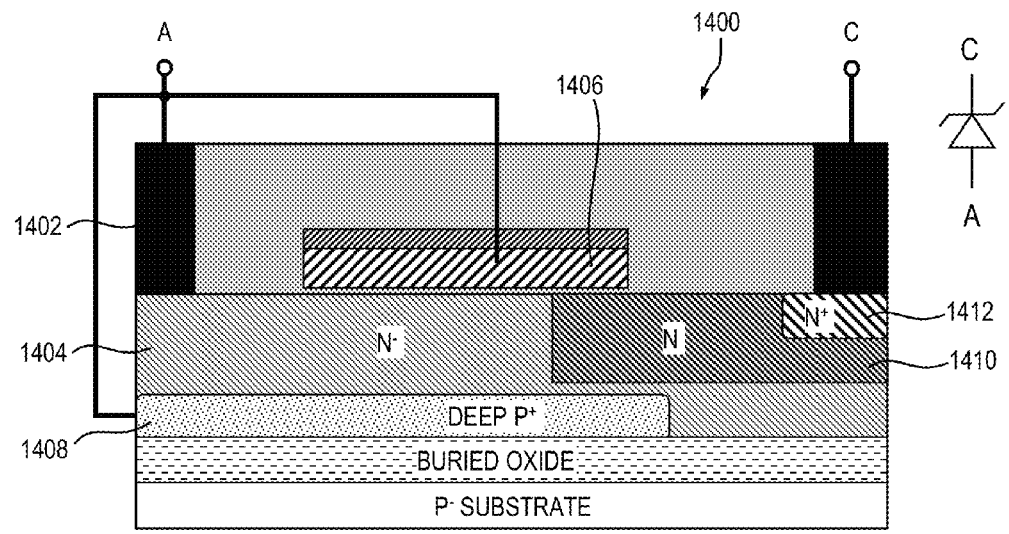
FIG. 14A is a cross-sectional view depicting at least a portion of an exemplary Schottky diode, according to an embodiment of the invention.

FIG. 14A is a cross-sectional view depicting at least a portion of an exemplary Schottky diode 1400, according to an embodiment of the invention. The Schottky diode 1400 is formed as a modification of the PN diode 1300 shown in FIG. 13. Specifically, the anode trench contact 1302 is omitted, along with the P body region 1102 (see FIG. 13), allowing a Schottky barrier to be created at an interface between the anode contact (metal) 1402 and an N⁻ active layer 1404. The top polycide layer 1406 and deep P well 1408 are electrically connected to the anode (A) terminal and induces a pinching of the electric field distribution under an applied blocking bias of the cathode (C) terminal. This pinching effect created by the placement of the gate stack at the top of the N⁻ region and the deep P well at the bottom of the N⁻ region, which is similar to an action of a JFET channel, shields the Schottky contact interface against any high electric field under blocking conditions. The shielding effect keeps leakage current in the diode 1400 low in the full range of the blocking voltage (e.g., about 12 volts to about 20 volts, although the invention is not limited to any specific voltage or range of voltages). The value of the leakage current in the diode will be a function of doping characteristics of the N⁻ active region 1404 at the Schottky contact, as will be known by those skilled in the art. (See, e.g., U.S. Pat. No. 5,365,102, the disclosure of which is incorporated by reference herein in its entirety.) Shielding of the Schottky contact enables a higher doping of the semiconductor at the Schottky interface, as discussed below in conjunction with FIG. 14B, and enhances electrical performance of the diode.

The connection of the deep P well 1408 and the polycide structure 1406 with the anode contact 1402 can be formed in a manner consistent with the connection 1252 shown in FIG. 12B for the illustrative BJT device 1250. Specifically, the connection between the deep P layer 1408 and the polycide structure 1406 is preferably formed as small spots by interrupting the anode contact 1402 along a finger layout. The connection, in this embodiment, is formed as a lateral extension of the titanium (Ti)/titanium nitride (TiN) layer (not explicitly shown in FIG. 14A, but implied in a manner similar to the connection 1252 shown in FIG. 12B) and overlaps the polycide structure 1406. These contacts are preferably placed at prescribed intervals along the polycide stripe (e.g., the polycide region which, in the case of a MOSFET, would be the gate patterned as a stripe), and the polycide layer is used to create a low resistivity shielding structure which is operative to shield the Schottky contact against any high electric field under blocking conditions, as previously stated.

The initial high-voltage capability and the avalanche ruggedness of the MOSFET structure are preserved, as the blocking voltage is sustained by the device structure on the cathode (former drain) side of the top polycide electrode, and the avalanche breakdown is clamped by the PN junction at the upper right corner (i.e., tip) of the deep P well 1408. The deep well 1408 is preferably an implanted well with a maximum doping concentration close to the Si/buried oxide interface. In a preferred embodiment, the maximum doping concentration is in the range of about 5e16 atoms/cm³ and 5e17 atoms/cm³, and the doping profile is configured to slope down towards the surface. It is to be appreciated, however, that the invention is not limited to a specific doping concentration or profile of the deep well 1408. The PN junction, in this embodiment, is formed by the deep P well 1408, N⁻ active layer 1404, N region 1410 and N⁺ region 1412 toward the cathode terminal.

Figure 14B:
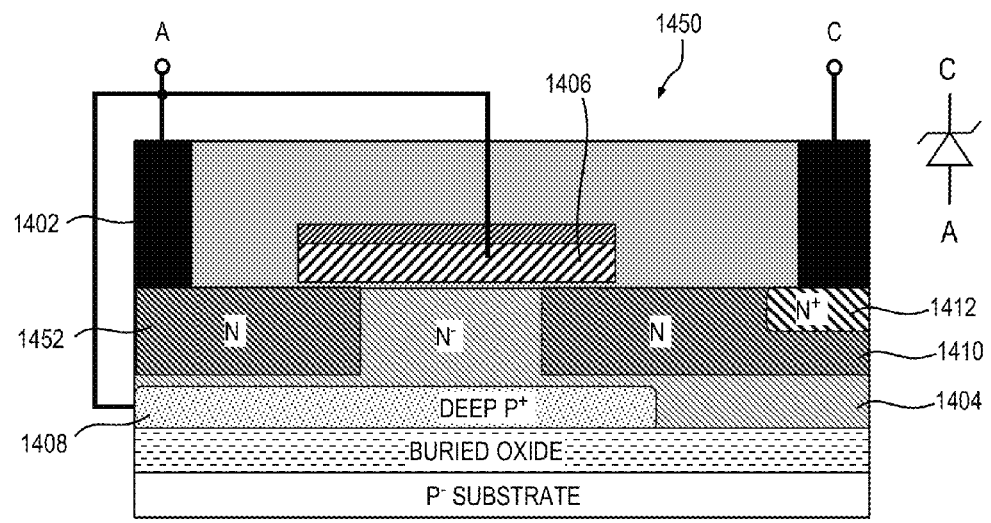
FIG. 14B is a cross-sectional view depicting at least a portion of an exemplary Schottky diode, according to another embodiment of the invention.

FIG. 14B is a cross-sectional view depicting at least a portion of an exemplary Schottky diode 1450, according to another embodiment of the invention. The Schottky diode 1450 is essentially the same as the Schottky diode 1400 depicted in FIG. 14A, except that an additional N region 1452 is formed in the N⁻ active layer 1404, proximate an upper surface of the N⁻ active layer, in a manner similar to N region 1410. An advantage of the Schottky diode 1450, compared to Schottky diode 1400 shown in FIG. 14A, is that the forward voltage drop of the Schottky diode 1400 depicted in FIG. 14A can be reduced by increasing the doping concentration of the N⁻ active layer 1404 proximate the Schottky contact. In a preferred embodiment, this is achieved by extending the N implant region 1410 at the cathode side of the polysilicide region to the region under the anode (A) contact 1402, shown as N region 1452 in FIG. 14B.

As described herein above in conjunction with the exemplary structures depicted in FIGS. 10A through 14B, an important benefit according to one or more embodiments of the invention is the inclusion of the deep well which is configured to clamp the breakdown voltage away from the silicon/oxide interface. This arrangement advantageously enables the structure to absorb avalanche energy without experiencing reliability issues. Additional structures according to other embodiments of the invention incorporate a similar configuration of the drain region, thus inheriting the avalanche ruggedness of the parent MOSFET design shown, for example, in FIGS. 9A and 9B.

Figure 15:
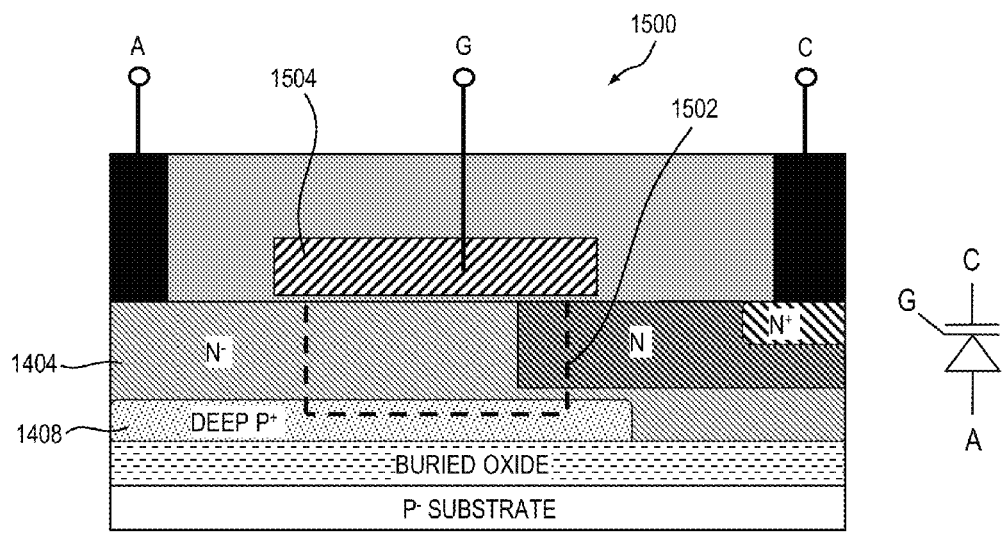
FIG. 15 is a cross-sectional view depicting at least a portion of an exemplary Schottky diode, according to a third embodiment of the invention.

FIG. 15 is a cross-sectional view depicting at least a portion of an exemplary Schottky diode 1500, according to another embodiment of the invention. Schottky diode 1500 is formed as a modification of the illustrative Schottky diode 1400 depicted in FIG. 14A. Specifically, in a manner consistent with the modification of the MOSFET 900 shown in FIG. 9, gate trenches 1502 are formed in the device, preferably along a current flow path in the N⁻ mesa region (i.e., active layer) 1404 underneath a polycide electrode 1504 formed on an upper surface of the active layer of the diode 1500. The gate trench structure 1502 additionally improves the shielding effect of the Schottky contact against the blocking voltage applied to the cathode (C) terminal. In the Schottky diode 1500, the gate electrode is decoupled from an anode (A) terminal and can be used to further modify a conduction path between the gate trenches 1502. The anode terminal is connected to the deep P well 1408 in a third dimension, which is not explicitly shown but is implied. The Schottky diode 1500 may be referred to herein as a switched Schottky diode and represents a new type of power device, according to an embodiment of the invention.

Figure 16:
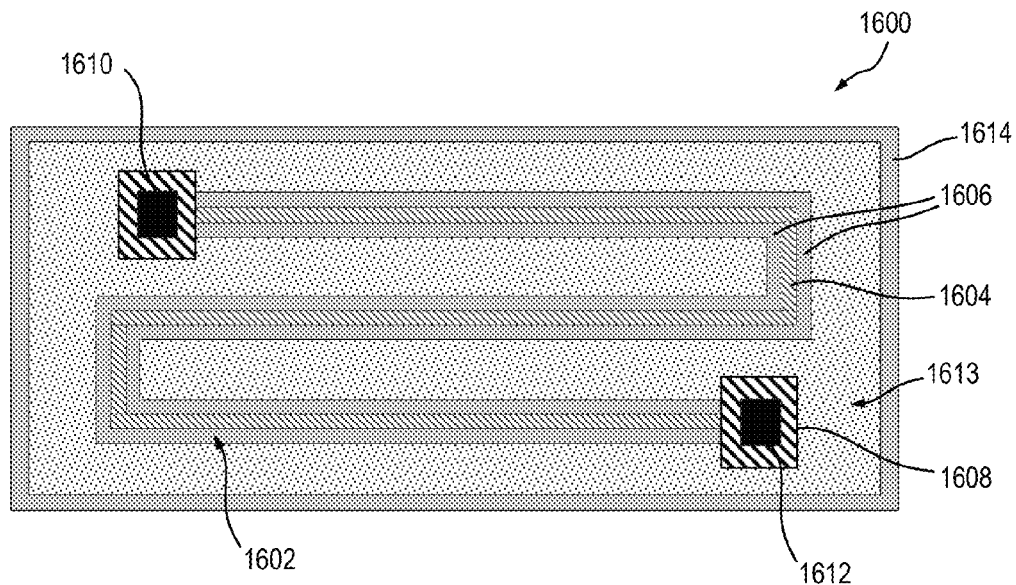
FIGS. 16 and 17 are top plan and cross-sectional views, respectively, depicting at least a portion of an exemplary resistor structure in a serpentine layout, according to an embodiment of the invention.
Figure 17:
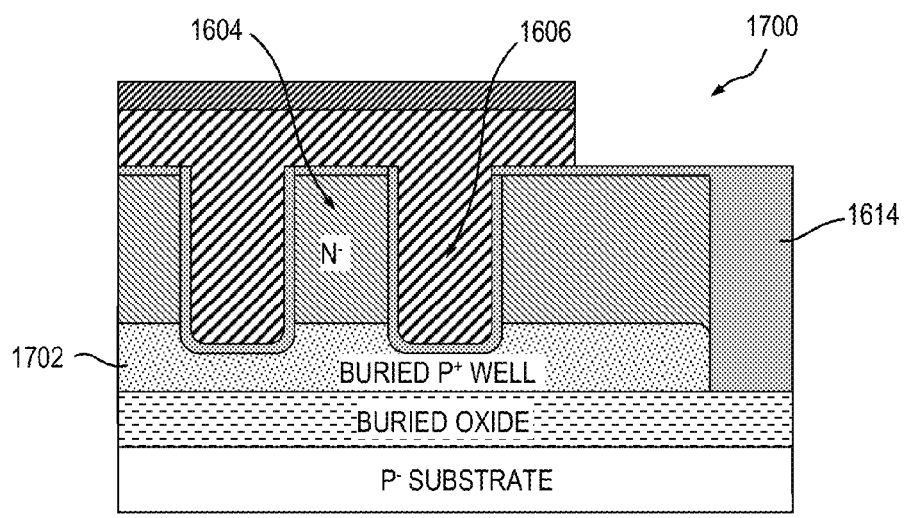

FIGS. 16 and 17 are top plan and cross-sectional views, respectively, depicting at least a portion of an exemplary resistor structure 1600 in a serpentine layout, according to an embodiment of the invention. The resistor path 1602 is defined by an N⁻ region 1604 between gate trenches 1606, which is connected to N⁺ contact regions 1608 and 1610 on both ends of the serpentine. One of the N⁺ contact regions, e.g. 1608, includes a trench contact 1612 to a deep P well 1603 (not explicitly shown in FIG. 16, but shown in FIG. 17 as well 1702). The P well 1603 isolates the N⁻ resistor path 1602 from a bottom, as shown in the cross-sectional view of FIG. 17. As shown in FIG. 17, buried P deep well 1702 is operative to electrically isolate the resistor formed by the N⁻ region between the trenches. Lateral isolation regions 1614, which may comprise an oxide or other dielectric material, are formed in the resistor structure 1600 to electrically isolate the resistor from other circuit components on the die.

Figure 18:
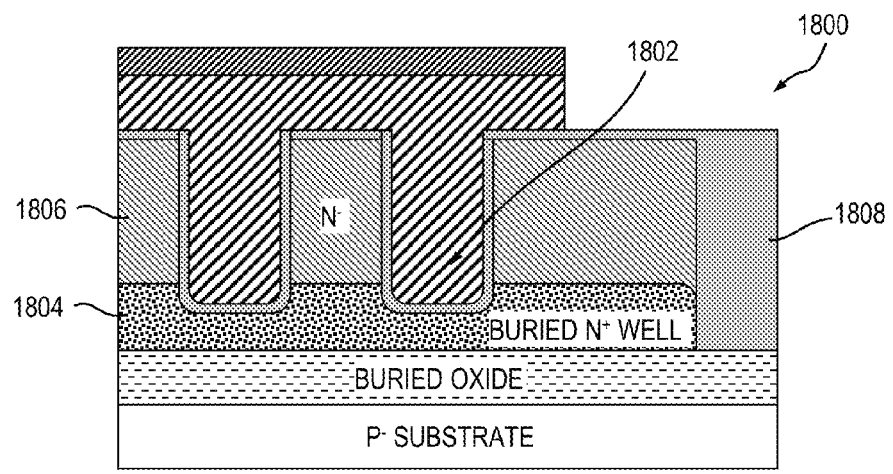
FIG. 18 is a cross-sectional view depicting at least a portion of an exemplary capacitor structure, according to an embodiment of the invention.

With reference now to FIG. 18, a cross-sectional view depicts at least a portion of an exemplary capacitor structure 1800, according to an embodiment of the invention. The capacitor structure 1800 can have a serpentine layout similar to the resistor structure 1600 shown in FIG. 16, or it may be comprise multiple parallel stripes formed by the trenches 1802. Capacitor electrodes 1802 are formed by the polysilicon fill in the gate trenches and by the deep N⁺ well 1804 at the bottom of the active layer 1806. Both regions are connected to terminals at ends of the serpentine layout, not explicitly shown but implied. Lateral isolation regions 1808, which may comprise an oxide or other dielectric material, are formed in the capacitor structure 1800 to electrically isolate the capacitor from other circuit components on the die.

Figure 19:
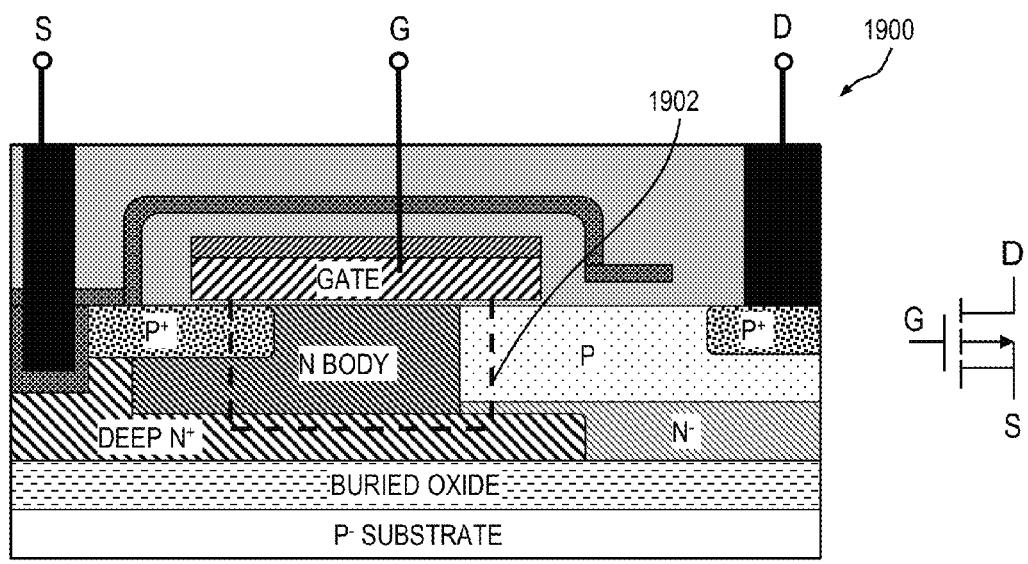
FIG. 19 is a cross-sectional view depicting at least a portion of an exemplary P-channel MOSFET, according to an embodiment of the invention.

FIG. 19 is a cross-sectional view depicting at least a portion of an exemplary P-channel MOSFET 1900, according to an embodiment of the invention. The MOSFET 1900 is formed as a modification of the N-channel MOSFET 900 shown in FIG. 9, wherein a polarity type of the material used to dope the body (P body in FIG. 9), as well as source and drain regions, have been reversed to create a P-channel LDMOS transistor. The implants dedicated to form a P-channel MOSFET in parallel to the N-channel transistor increases the mask count compared to the process used to make the N-channel LDMOS transistor 900 only, as will be known by those skilled in the art. As with the N-channel LDMOS transistor 1000 shown in FIG. 10A, one simplification in the fabrication of MOSFET 1900 involves removal of the gate trenches 1902. A primary impact on the performance of the resulting MOSFET device is a smaller gate width per unit area, which increases on-resistance, $R_{ON}$, in the device. This increased on-resistance can be leveraged by making the channel length shorter, as the alignment restriction related to an overlap of the gate polysilicon over the gate trench endings is removed.

The exemplary electronic components depicted in FIGS. 9 through 19 can be used to build a BiCMOS circuit including power switches, diodes, and some associated circuitry. The BiCMOS process flow includes a basic mask set allowing manufacturing of components presented in FIGS. 9 through 17, and an additional mask subset allowing the component portfolio to include the structures shown in FIGS. 18 and 19. As used herein, the phrase "basic mask set" is defined broadly to refer to a minimum number of mask levels required to fabricate a set of devices based on an NFET structure according to embodiments of the invention.

Figure 20A:
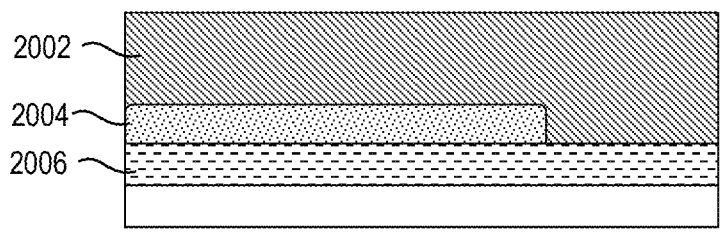
FIGS. 20A through 20F are cross-sectional views depicting an exemplary BiCMOS process flow, according to an embodiment of the invention.
Figure 20B:
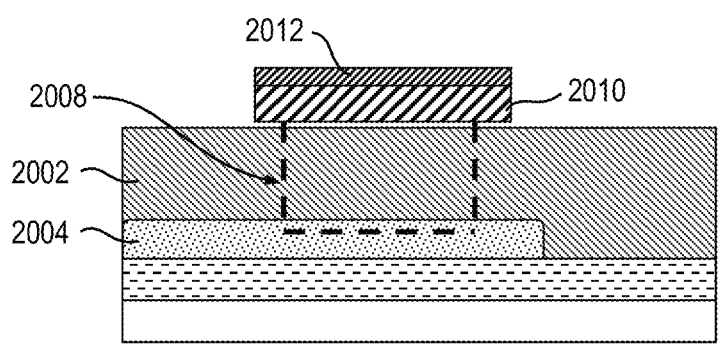

With reference now to FIGS. 20A through 20F, cross-sectional views, collectively, depict an exemplary BiCMOS process flow, according to an embodiment of the invention. The process flow uses a basic mask set for manufacturing circuit components based on modifications of the N-channel LDMOS device shown in FIG. 9, as described herein above. The process is based on an SOI substrate with a P⁻ handle wafer, and an N⁻ active layer. By way of example only and without limitation, an illustrative process flow in accordance with one or more embodiments of the invention includes the following primary steps:

Form a lateral dielectric isolation, also referred to as lateral trench isolation (LTI), by etching a trench through an active layer 2002, and filling the trench with oxide or a combination of oxide and polysilicon using a first mask step (LTI mask), as shown in FIG. 20A;

Deposit a thick field oxide and pattern it with an active area mask (active mask);

Deep implantation of boron, or an alternative dopant, to form a local deep well 2004, or alternatively an N⁺ well as a function of the dopant employed, with a concentration peak close to an interface between the P well (buried layer (BL)) 2004 and a buried oxide 2006 using a second mask step (deep well mask), as shown in FIG. 20A;

Pattern a mask to define a position of one or more gate trenches 2008 through the active layer 2002 into the buried well 2004 using a third mask step (trench gate mask), as shown in FIG. 20B; etch the gate trench with rounded bottom and top corners, grow a thermal gate oxide on the sidewalls and bottom wall of the gate trench, and fill the trench with polysilicon 2010, not explicitly shown but implied in FIG. 20B; in an alternative embodiment, the steps for forming the gate trench can be omitted, thereby simplifying the NFET structure shown in FIGS. 9A and 9B to form the structures shown in FIGS. 10A and 10B.

Figure 20C:
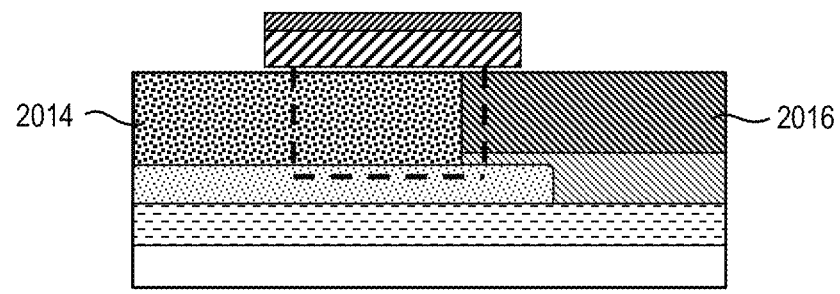
Figure 20D:
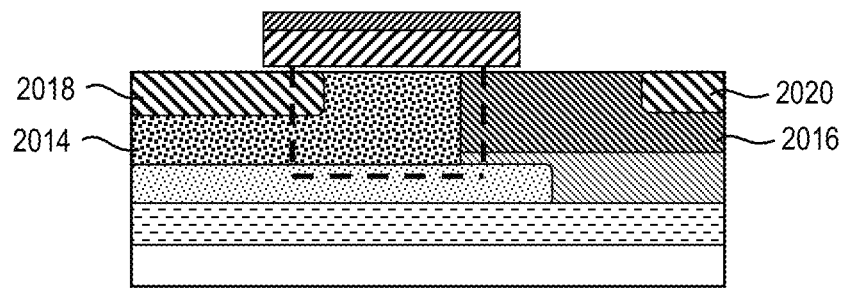
Figure 20E:
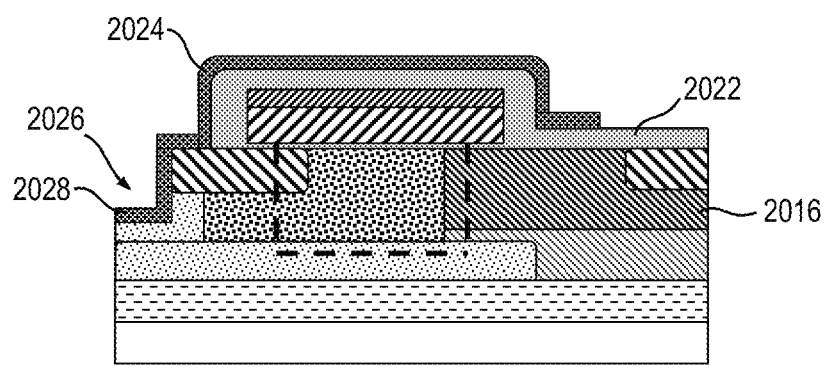
Figure 20F:
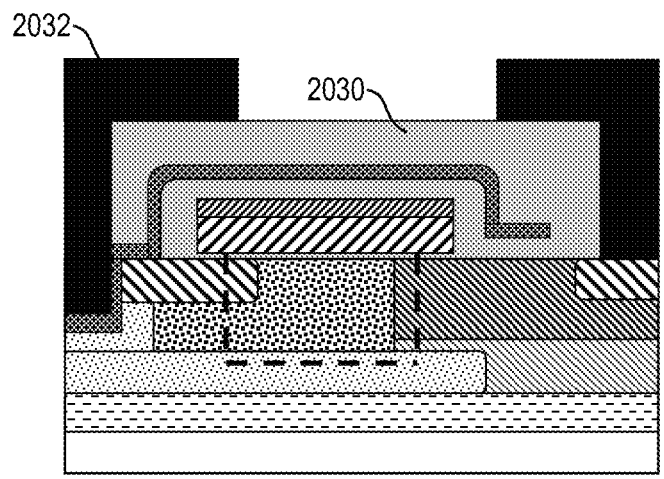

Dope the polysilicon 2010 by phosphor implantation, or an alternative dopant, and anneal, and deposit a silicide layer 2012 on the top to reduce gate parasitic resistance, as shown in FIG. 20B;

Pattern the polycide layer 2012 to form a gate structure using a fourth mask level (polysilicon mask), as shown in FIG. 20B;

Implant boron to create a body region 2014 self-aligned to the edge of the polycide layer 2012 using a fifth mask step (body mask). Perform body diffusion, for example with a dedicated thermal anneal, as shown in FIG. 20C;

Implant phosphor or arsenic, or an alternative dopant, to create a lightly doped drain (LDD) extension 2016 at the other edge of the polycide layer 2012, opposite the edge used to form the body region 2014, using a sixth mask step (LDD mask), as shown in FIG. 20C;

Create highly doped source region 218 and drain region 220 in the body region 2014 and LDD extension 2016, respectively, by shallow arsenic implantation using a seventh mask step (source/drain mask), as shown in FIG. 20D;

Deposit field oxide 2022 over a top surface of the structure to assure a pre-defined spacing of a field plate 2024 from the surface of the drain extension region 2016 as shown in FIG. 20E;

Etch a shallow source contact trench 2026 using an eighth mask step (trench contact mask), and implant $BF_2$ through the trench bottom (plug implant) to assure a good ohmic contact to the body and deep P regions, as shown in FIG. 20E;

Deposit and sinter a silicide film 2028 (e.g., Ti/$WSi_x$ or Ti/TiN) lining the trench contact walls to create an electric short between source and body regions, as shown in FIG. 20E. During the sintering process, a silicide (e.g., $TiSi_x$) is created at the Si/Ti interface. Such a contact formation methodology is well known to those skilled in the art;

Pattern the contact silicide layer allowing a lateral extension to overlap the gate structure and create a field plate in the proximity of the LDD/oxide interface using a ninth mask step (field plate (FPL) mask), as shown in FIG. 20E;

Deposit an interlayer dielectric film (ILD) 2030 and apply a chemical-mechanical polishing step (CMP), or an alternative planarization process, to achieve a substantially planar top surface, as shown in FIG. 20F;

Etch via openings to access source, drain and gate contact areas using a tenth mask step (via mask). Fill vias with tungsten plugs (Ti/TiN/W), or an alternative conductive material, and apply a CMP step to planarize the top surface again, as shown in FIG. 20F; and Deposit and pattern a thick aluminum layer 2032 to create top electrodes with source, drain, and gate bus structures using an eleventh mask step (metal mask), as shown in FIG. 20F.

As discussed above, the processing of an N-channel LDMOS (NFET) transistor, in this embodiment, requires eleven mask levels (i.e., steps). The number of mask levels can be reduced to ten if the gate trench processing is omitted, as noted above. An optional mask can be used to create an electrical contact to the substrate by etching a deep trench through the active layer and the buried oxide, and filling it with oxide and doped polysilicon.

In order to create a P-channel MOSFET (PFET) using the same process flow, an additional mask subset is required. According to an illustrative embodiment of the invention, dedicated additional implants are made using the following mask levels: P-BL, P-POLYDOP, P-BODY, P-LDD, P-S/D, and P-CONT, where P-BL refers to a P-type doping of the buried layer, and P-POLYDOP refers to a mask level enabling P doping of Polysilicon for the PFET devices. In this case an additional N-POLYDOP mask level is used for the N+ doping of polysilicon for NFET devices.

Thus, the complete mask set in the exemplary BiCMOS process, according to embodiments of the invention, includes a maximum of 18 to 20 levels. This process flow allows a design of all the exemplary electronic components shown in FIGS. 9A through 19 which may be used to manufacture a power IC.

Processing details are well known to those skilled in the art and will therefore not be presented in further detail herein. By way of example only and without limitation, illustrative values for certain technological process parameters are listed below for the case of fabricating an exemplary 20-volt N-channel MOSFET:

SOI substrate: lightly doped handle wafer (e.g., <5e14 $cm^{-3}$), 0.3-μm buried oxide, and 0.6-μm active film with a doping of around 1e16 $cm^{-3}$.

Buried P well: Boron implant with a dose of 2e13 $cm^{-2}$ and energy of 180 keV.

Gate trench: 0.3 μm wide, 0.3 μm deep, and 0.3 μm long.

Polycide layer: 0.3-μm polysilicon and 0.1-μm $WSi_2$. Polycide stripe width 0.45 μm covering gate trench, or 0.35 μm for the case of the NFET without gate trenches Body region: Boron implant with a dose of 3e13 $cm^{-2}$ and energy of 30 keV, followed by a second boron implant with a dose of 4e13 $cm^{-2}$ and energy of 90 keV, and a 60 minutes anneal at 1000° C.

LDD region: Phosphor implant with a dose of 6e12 $cm^{-2}$ and energy of 60 keV.

S/D regions: Arsenic implant with a dose of 5e15 $cm^{-2}$ and energy of 30 keV.

Contact trench: 0.4 μm wide and 0.25 μm deep.

Silicide film: Ti (300 Angstroms (Å))/TiN (800 Å) annealed at 800° C.

Plug implant: $BF_2$ implant with a dose of 7e14 $cm^{-2}$ and energy of 30 keV.

Top metal: AlSiCu (1.5 μm thickness) patterned with 0.5 μm metal-to-metal spacing.

Features and advantages achieved according to embodiments of the invention include, but are not limited to, one or more of the following, although a given embodiment may not necessarily include all of these features or only these features:

Exploits unique aspects of the BiCMOS process, like manufacturing of all integrated power devices with the same set of process steps;

Doping and placement of the deep buried well defines the breakdown voltage and the location of avalanche impact ionization within all SOI power devices; i.e., a clamping diode is effectively integrated in the device, thereby assuring high avalanche ruggedness;

BiCMOS process flow is defined with an aim to minimize SOI-LDMOS power losses in SMPS applications. Other power devices like PN diodes Schottky diodes, and BJTs are obtained by modification of the SOI-LDMOS structure;

PN diode is obtained by removing $N^+$ source region from N-channel LDMOS structure;

Schottky diode is obtained by removing P body region from the PN diode structure;

Bipolar transistor is obtained by removing the electrical short between source and body regions. Gate stack is connected to the body region and builds a current bus structure used as a base terminal;

Chip scale package (CSP) or wafer level packaging (WLP) is adopted to create current terminals on the top surface of the finished die.

As previously stated, an important benefit of embodiments of the invention is the ability to easily facilitate the integration of power circuits and/or components (e.g., drivers and power switches) on the same silicon substrate as corresponding control circuitry for implementing a power control device. By way of example only and without limitation, FIGS. 21A through 22E are cross-sectional views depicting at least a portion of an exemplary BiCMOS process flow for integrating two power devices on the same substrate, according to an embodiment of the invention. Specifically, FIGS. 21A through 22E conceptually illustrate an exemplary process flow which utilizes the same process steps for integrating a power N-channel MOSFET and a power Schottky diode on a common SOI substrate. Other devices, such as, for example, PN diodes and BJTs, can be fabricated within the same process step sequence.

Figure 21A:
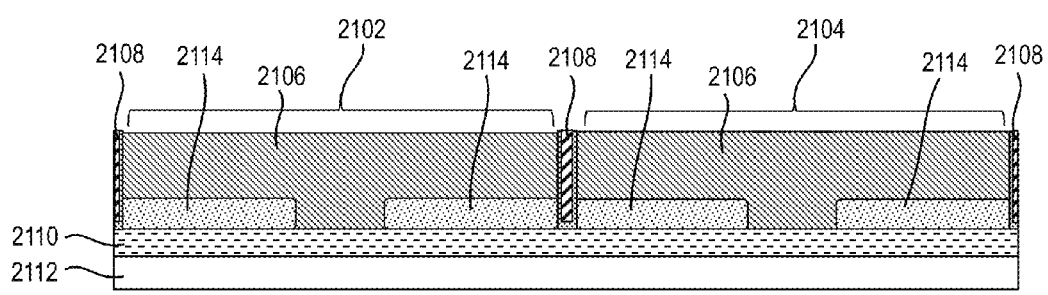
FIGS. 21A through 21E are cross-sectional views depicting at least a portion of an exemplary BiCMOS process flow for integrating a two power devices on the same SOI substrate, according to an embodiment of the invention.

With reference to FIG. 21A, at least two active regions 2102 and 2104 are shown. Each of the active regions 2102 and 2104 in which devices will be formed, in this embodiment, comprise respective $N^-$ active regions 2106 separated by a lateral isolation trench 2108, although the active regions 2106 may be of a different conductivity type in other embodiments. Lateral isolation trenches 2108 are used to separate other adjacent active regions 2106 for forming other devices and/or structures. Using process steps previously described, the active regions 2106 are formed on a common buried oxide layer 2110 which in turn is formed on an N- or P-type substrate 2112. Buried P wells 2114 are formed in the respective $N^-$ active regions 2106, proximate an interface between the buried oxide layer 2110 and the active regions.

Figure 21B:
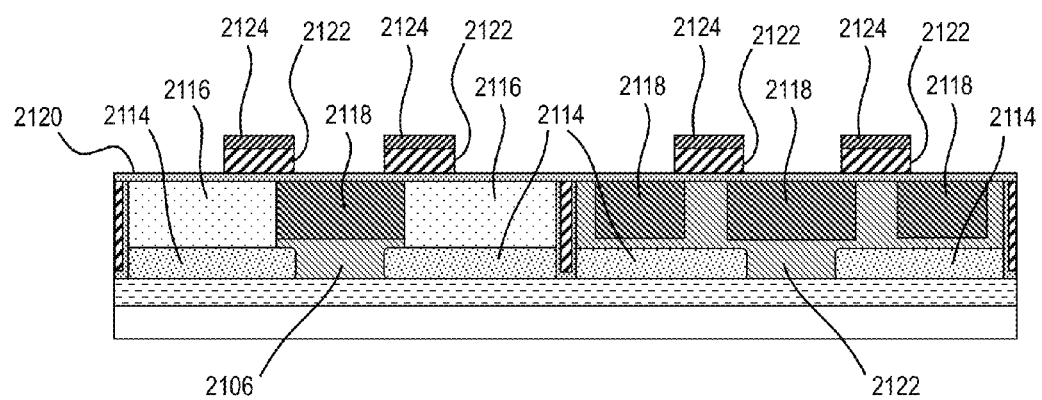
Figure 21C:
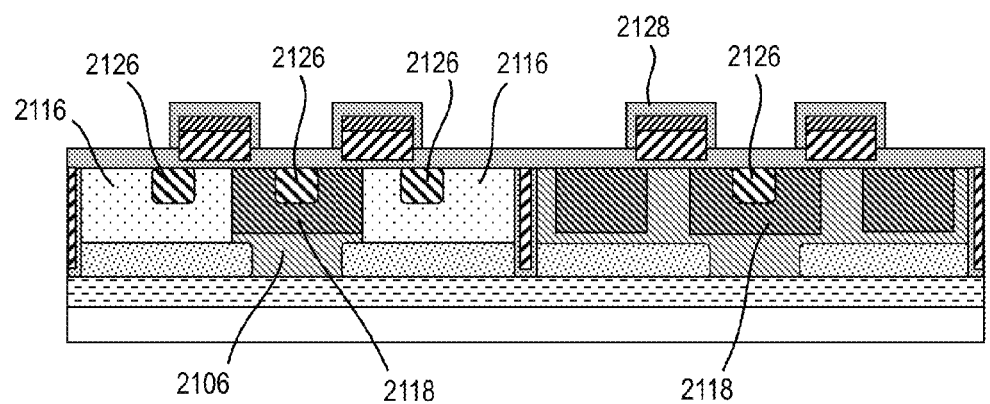

In FIG. 21B, a gate oxide layer 2120 is formed over the surface of the SOI structure. A layer of polysilicon 2122 is deposited on the gate oxide layer 2120 and patterned to form gate structures. A silicide layer 2124 is optionally deposited on the polysilicon gate structures 2122. Then, P body regions 2116 are formed by doping the active region 2106 over at least a portion of the buried wells 2114, whereby the P implant used to form the P body regions is self-aligned to one edge of the polycide regions. N regions 2118 are also formed in the active layer 2106. In active region 2102, the N region 2118 is formed between the P body regions 2116 allocated to build a MOSFET structure (e.g., NMOS device 1000 shown in FIG. 10). The same implantation step is used to form N regions 2118 in the structure of a Schottky diode, as previously shown in FIG. 14B. FIG. 21C shows doped $N^+$ regions 2126 formed in P body regions 2116 and N regions 2118. An oxide layer 2128 is formed over at least a portion of the upper surface of the SOI structure.

Figure 21D:
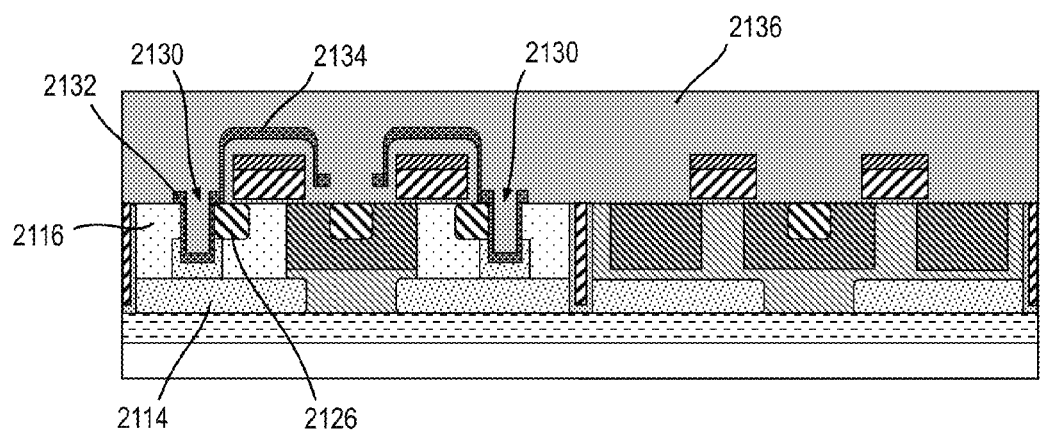
Figure 21E:
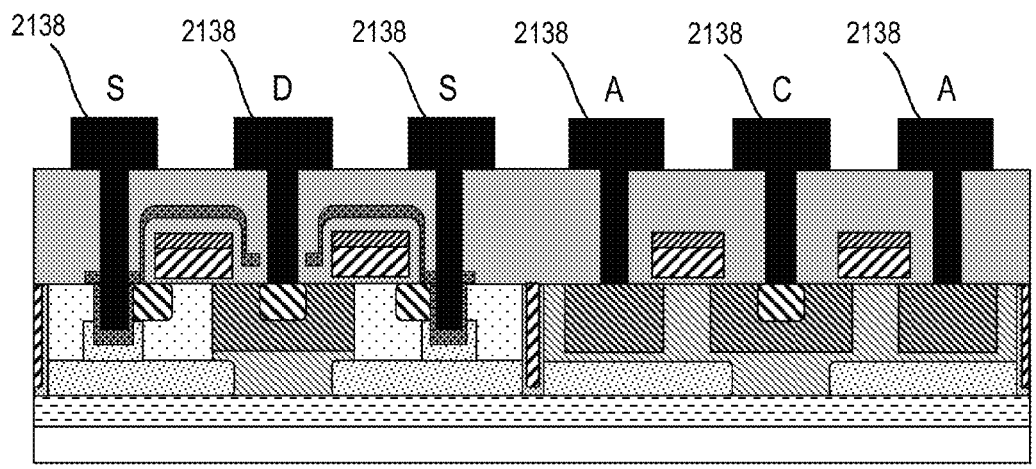

With reference to FIG. 21D, trenches 2130 are formed substantially vertically through the oxide layer 2128, the P body region 2116, and contacting the buried P well 2114. A silicide or titanium/titanium nitride layer 2132 is formed on sidewalls and a bottom wall of the trenches 2130. The silicide layer 2132 lining the trenches 2130 contact the $N^+$ doped regions 2126 in the P body region 2116. Shield field plates 2134, which in this embodiment are formed as lateral extensions of the silicide layers 2132 lining the trenches 2130, overlap the gate structures and come into close proximity with an oxide interface along the N active region 2118. An oxide layer 2136 is then formed over at least a portion of the upper surface of the SOI structure. FIG. 21E depicts the oxide layer 2136 etched to form contact trenches (i.e., vias), which are subsequently filled with a metal (e.g., aluminum), or an alternative conductive material, to form device contacts 2138.

A semiconductor structure in accordance with one or more embodiments of the invention described herein is particularly well-suited for use in RF power amplifier applications, including, but not limited to, a power amplifier (PA) stage in an RF transceiver system. As is well known, in an RF power amplifier stage, the high-frequency transmit signal is amplified to a prescribed output power level and this amplified transmit signal is then radiated by an antenna where it is picked up by a receiver.

Figure 22:
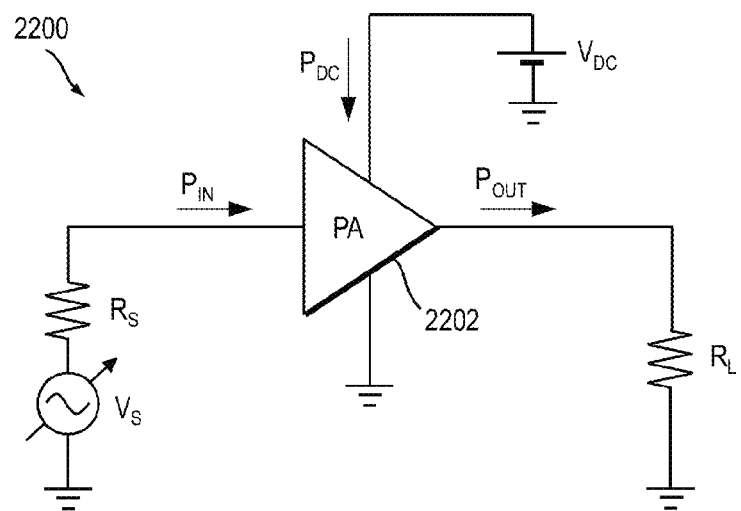
FIG. 22 is a schematic diagram conceptually depicting a simplified power amplifier (PA) system in which one or more embodiments of the invention can be employed.

FIG. 22 is a schematic diagram conceptually depicting a basic PA system 2200 in which embodiments of the present invention can be implemented. The system 2200 comprises a PA 2202 and some external components coupled with the PA. The PA 2202, like essentially all amplifiers, can be considered a three-port network comprising a main input direct current (DC) port, an input signal port and an output signal port. A voltage source, $V_{DC}$, supplies a DC voltage to the input DC port to provide power for the PA 2202. An input signal source, $V_S$, supplies an input signal having a measured power, $P_{in}$, associated therewith. The input signal source is shown having an impedance $R_S$ associated therewith. An output load having an impedance $R_L$, is shown coupled with the output signal port. The power measured at the output signal port, $P_{out}$, corresponds to the power at a fundamental frequency and at all spurious frequencies generated by the PA itself. The measured input DC power, $P_{DC}$, includes the power associated with all bias lines in the PA; although the input signal port usually has a DC bias which is small in an AB class amplifier, it is assumed that ideally no DC power enters or leaves the two signal ports. Since all amplifiers have a finite power gain, the input signal power $P_{in}$ will contribute directly to the output signal power $P_{out}$.

At low signal frequencies, power amplifiers may have relatively high levels of power gain, G, where $G=P_{out}/P_{in}$. Consequently, the direct contribution of the input signal power to the output signal power is significant and, therefore, is not included in the overall efficiency calculations of the PA. The basic efficiency, $\eta$, of the PA 2202 can be expressed as:

$$\eta = \frac{P_{out}}{P_{DC}} \times 100\%$$

Linearity and efficiency are often considered two of the most important performance parameters of a PA system. Although linearity and efficiency are affected by one another, and are therefore not mutually exclusive parameters, there is at least one important conceptual difference between the two: linearity is typically dictated by specification whereas efficiency is typically unspecified. Stated another way, linearity is a parameter which must meet prescribed specifications while efficiency is merely a figure of merit of the PA system.

Figure 23:
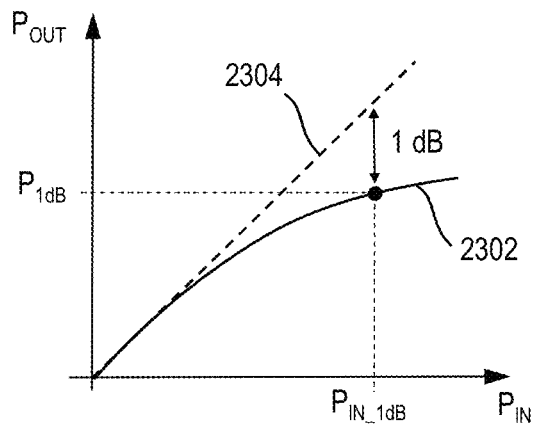
FIG. 23 is a graph conceptually depicting the nonlinear behavior of a PA system.

Linearity is often discussed in the context of power transfer characteristics, which defines the output power $P_{out}$ of the PA 2202 as a function of the applied input power $P_{in}$. With reference to FIG. 22, if the output power $P_{out}$ is measured as the input power $P_{in}$ is swept over a prescribed range, then a plot of $P_{out}-P_{in}$ results, representing the power transfer characteristic of the PA 2202. An illustrative plot 2302 of $P_{out}$ versus $P_{in}$ is shown in FIG. 23, along with an ideal plot 2304 where $P_{out}=P_{in}$. The point at which the output power $P_{out}$ exhibits a one decibel (dB) loss compared to the applied input power $P_{in}$ is often used as a criteria for describing the linearity performance characteristic of the PA.

Figure 24:
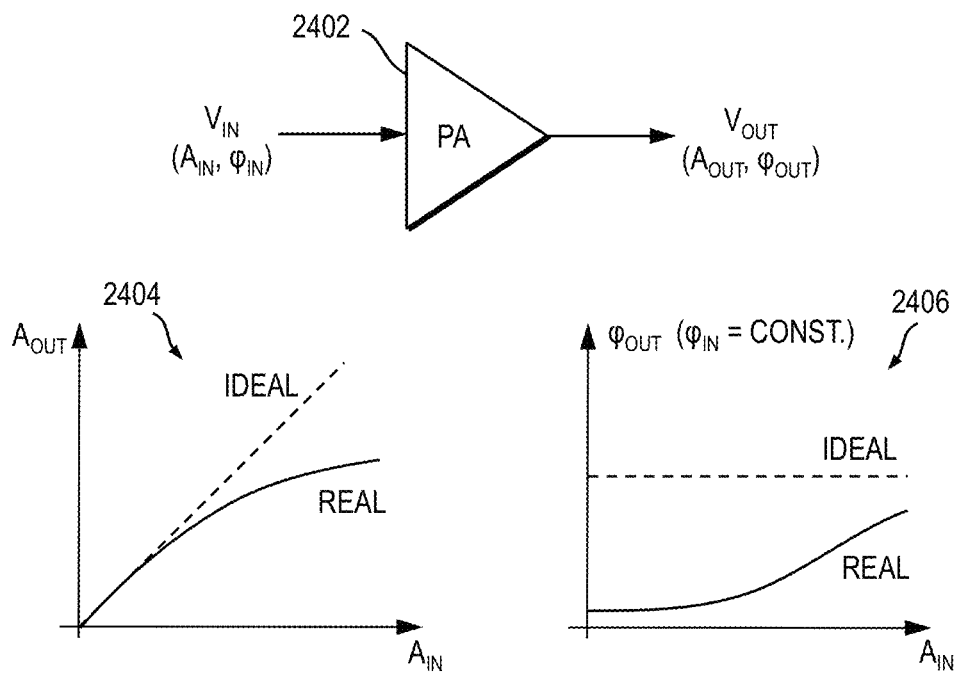
FIG. 24 is a graph conceptually depicting the nonlinear relationship between output power and input voltage in a PA.

The nonlinear relationship between output power and input power of the PA leads to distortion of the signal, as shown conceptually in FIG. 24, and results in intermodulation distortion (IMD) of a transceiver, or alternative circuit application, in which the PA is utilized. With reference to FIG. 24, a PA 2402 is shown which receives an input signal, $V_{in}$, having an amplitude $A_{in}$ and phase $\phi_{in}$ associated therewith, and generates an output signal, $V_{out}$, having an amplitude $A_{out}$ and phase $\phi_{out}$ associated therewith. A first illustrative graph 2404 presents actual (real) versus ideal output amplitude $A_{out}$ as a function of input amplitude $A_{in}$ of the PA 2402, and a second graph 2406 presents actual (real) versus ideal output phase $\phi_{out}$ as a function of input amplitude $A_{in}$ for a constant input phase $\phi_{in}$.

As is known by those skilled in the art, IMD occurs as two or more signals pass through a two-port network having a nonlinear transfer function. The spectrum at the output of the PA is comprised of the original signals and any additional spurious signals. These additional spurious signals can cause interference within the original system or in other systems. When the spurious signals are of sufficient amplitude, they can overpower the signal of interest, resulting in loss of transmitted information.

When operating at near-peak efficiency, the RF power amplifiers commonly used in wireless base stations distort the signals they amplify. These signal distortions not only affect signal clarity, they also make it difficult to keep the signal within its assigned frequency band, thus resulting in spurious emissions. Base station operators risk violating Federal Communications Commission (FCC) and international regulatory agency standards if they cannot keep spurious amplifier emissions from interfering with adjacent frequencies. Modern wideband code division multiple access (WCDMA) and long term evolution (LTE) carriers utilize wider bandwidths than their predecessors, thereby increasing the likelihood of interference from spurious emissions. To reduce spurious emissions and increase amplifier output linearity, base station operators can reduce the power output of the amplifier, but this practice also reduces efficiency. Amplifiers operating below their peak efficiency dissipate more energy, generally in the form of heat, sometimes requiring costly cooling equipment to prevent overheating.

These power amplifiers require a very high gain and ideally should add no or little distortion to the signal. But this is not practically possible, since increasing the power efficiency of the signal would increase the distortion added to the signal and drives the device into nonlinearity. For an efficient communication system, the power efficiency of the system should be increased without making the system nonlinear. This linearity is conventionally achieved with the help of various predistortion techniques implemented in conjunction with the power amplifiers to linearize both the gain and phase response of the system. Some known predistortion techniques include, for example, feedforward, feedback and digital predistortion.

Feedforward linearization is a commonly used technique where the spurious, distorted PA output spectrum is modified via two complementary circuits: (i) an input signal cancellation circuit; and (ii) a distortion or error cancellation circuit. Unfortunately, however, feedforward linearization generally provides only moderate power efficiency and suffers from limited bandwidth. Contemporary analog RF techniques such as diode predistortion that are primarily operated in an open-loop configuration are also only moderately effective, but relatively simple to implement. Currently, digital baseband adaptive predistortion is a popular method, as it permits application of a variety of corrective algorithms and ensures reasonable bandwidths for common cellular phone standards such as, for example, code division multiple access (CDMA) and Global System for Mobile Communications (GSM). For third generation (3G) cellular systems, spectrum-efficient techniques are employed, including WCDMA and orthogonal frequency division multiplexing (OFDM), having higher spectrum efficiency; however, instantaneous input power changes continuously leading to nonlinearity. This is due, at least in part, to the fact that an envelope of the signal continuously varies in WCDMA and OFDM systems, and hence the instantaneous input power also changes.

Feedforward linearization is not only moderately effective, but it almost doubles the cost and power dissipation of the PA. A combination of digital signal processing (DSP) and microprocessor control allows widespread use of complicated feedback and pre-distortion techniques to help improve efficiency and linearity, but this approach significantly increases the complexity and cost of the system, making it prohibitive for mobile commercial applications. Accordingly, the most straightforward way of improving performance in the context of an RF power amplifier application is to develop RF transistors with truly linear characteristics. However, conventional vertical MOSFETs previously used for base station applications are not capable of achieving this objective.

More recently, LDMOS transistors have essentially displaced silicon bipolar transistors in the cellular base station market, due primarily to improvements in efficiency and linearity and cost-performance benefits that LDMOS transistors provide. However, drift of the threshold voltage of a standard LDMOS transistor during operation at its quiescent operating point continue to plague the technology. In spite of several generations of technology improvements, manufacturers could only guarantee a change in threshold voltage of less than ten percent over a 20 year time period, despite using costly burn-in to stabilize the devices. The undesirable drift in device threshold voltage over time arises from an injection of hot carriers (e.g., hot electrons) into a gate oxide of the device, creating a reliability issue and barrier to obtaining stable performance.

Discrete LDMOS transistors, such as the LDMOS transistor 500 shown in FIG. 5, are conventionally fabricated in bulk silicon technology, but the need for reduced parasitic elements in a power RF amplifier application essentially compels a monolithic integration of the entire RF amplifier system in a single chip. The SOI technology according to embodiments of the invention for forming an LDMOS structure, an example of which is shown in FIG. 9A, offers significant advantages, at least in terms of reduced capacitances, reduced cross-talk and increased integration density. With reference again to FIG. 9A, the SOI LDMOS transistor 900 according to one or more embodiments of the invention includes a buried oxide (BOX) layer for reducing capacitive coupling to a substrate, which improves power efficiency and provides good isolation between low-power and high-power circuitry in the amplifier system integrated together on the same chip, among other benefits. Moreover, SOI wafers with high resistivity substrates can be formed which allow the monolithic integration of high-Q inductors. These and other benefits favor the fabrication of RF power amplifiers using SOI technology.

In a power amplifier application, an RF MOSFET formed in accordance with aspects of the invention is preferably configured to be easily integrated into an IC and to satisfy one or more of the following design features:

sustain maximum prescribed drain and gate voltage corresponding to the DC supply voltage used in the power amplifier. Table 1 below presents certain DC supply voltage levels (VDS) used in modern mobile WiFi systems.

TABLE 1

| Supply Voltage ($V_{DS}$) | $V_{DS,max}$ | $V_{GS,max}$ |
|---|---|---|
| 3.5 V | 12 V | 5 V |
| 7.5 V | 20 V | 8 V |
| 12.5 V | 30 V | 12 V | produce high power gain allowing operation at popular carrier frequency bands, such as, for example, 900 MHz and 2 GHz. By way of illustration only and without limitation, an RF FET according to one or more embodiments exceeds 15 dB at 2 GHz.

exhibit truly linear transfer characteristics provide high-efficiency power amplification enable monolithic integration of passive matching filters and/or other circuits for on-chip signal processing provide a layout and package assembly which facilitates heat dissipation It is to be understood that the above features represent a non-limiting illustration of at least a portion of the benefits achievable according to aspects of the invention, and that other and/or additional features are similarly contemplated, as may become apparent to those skilled in the art given the teachings herein.

Relative to the layout of a power MOSFET, the layout of an RF FET formed in accordance with one or more embodiments of the invention is governed by a different set of design specifications. Table 2 below provides a comparison of illustrative layout rules which may be used in fabricating a power MOSFET and an RF FET for optimizing certain device parameters, including maximum drain current, $I_{D,max}$, gate width, and die area.

TABLE 2

| Parameter | Power MOSFET | RF FET |
|---|---|---|
| $I_{D,max}$ | Determined by electromigration limit for source/drain solder bumps | Determined by number and width of source/drain fingers |
| Gate width | Maximized for given $I_{D,max}$ to obtain minimum $R_{DS,on}$ | Minimized for given $I_{D,max}$ to reduce parasitic capacitances |
| Die area | Minimized for given gate width to reduce cost | Determined by power dissipation constraints |

Figure 25:
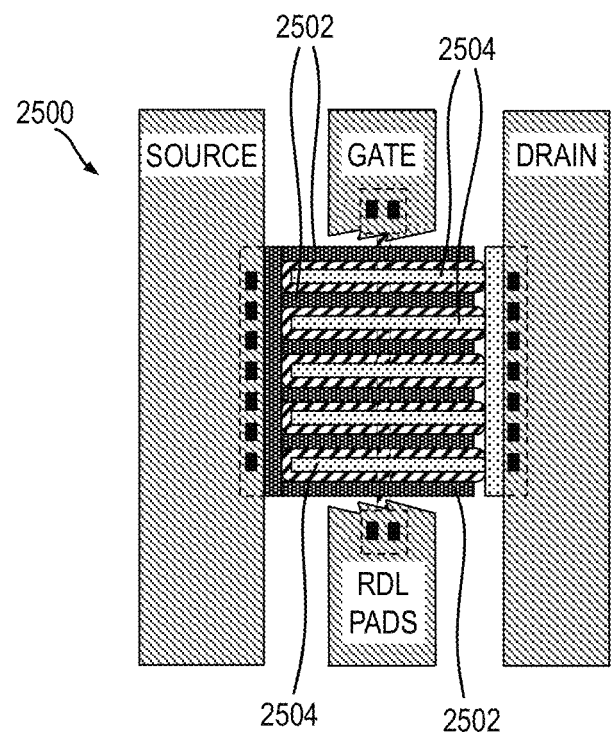
FIG. 25 is a top plan view conceptually depicting at least a portion of an exemplary layout of an RF MOSFET cell, according to an embodiment of the invention.

The power MOSFET has a compact layout, with the active area determined by the target on-resistance $R_{DS,on}$. In the case of a chip scale package (CSP), the maximum allowed current is limited by the current density along a perimeter of the solder bumps collecting current flowing through the source and drain terminals. In contrast, RF FETs do not necessarily target a minimal $R_{DS,on}$. Rather, an objective of an RF FET is to achieve a target maximum output current without infringement of the electromigration limit of the current density in the source and drain fingers. To this end, the RF FET, according to one or more embodiments, is comprised of a larger number of shorter interdigitated fingers. By way of example only and without limitation, FIG. 25 is a top plan view conceptually depicting at least a portion of an exemplary layout of an RF MOSFET cell 2500, according to an embodiment of the invention. As apparent from FIG. 25, the RF MOSFET cell 2500 is configured having a plurality of source fingers 2502 and a plurality of drain fingers 2504 that are interdigitated with one another to achieve a prescribed maximum output current.

With regard to gate width, as presented in Table 2 above, the gate width of a power MOSFET is generally maximized to reduce on-resistance $R_{DS,on}$. By contrast, the gate width of an RF transistor should be minimized to reduce parasitic capacitances, primarily gate capacitances, as imposed by a prescribed maximum output current requirement.

The total die area of a power MOSFET is typically kept to a minimum in order to reduce manufacturing cost associated therewith. An RF transistor, on the other hand, is not as sensitive to cost. Consequently, the total die area of an RF transistor is not necessarily minimized, but rather die size is determined by heat dissipation constraints, which is dictated primarily by power dissipation in the device.

The exemplary layout of the RF MOSFET cell 2500 shown in FIG. 25 is suitable for chip-scale package (CSP) assembly. With reference again to FIG. 25, the top level metal in the fabrication of the RF MOSFET 2500 is preferably a thick copper (Cu) layer, often referred to as redistribution layer (RDL), which is patterned to form top power terminals in the form of large area source, drain and gate pads. The die is flipped, and these large area pads are soldered to the routing of the assembly carrier, typically high ohmic ceramics. This approach facilitates heat dissipation from the power amplifier.

As previously explained in conjunction with FIGS. 10A and 10B, the unique configuration of the deep buried well 902 serves to pin a location of the avalanche impact ionization under blocking condition in the proximity of the drain contact, away from the gate oxide. This arrangement enhances gate oxide reliability and increases the ability of the transistor to absorb avalanche energy. This same deep buried well 902, in conjunction with the top field plate 1012 in FIG. 10B, is configured to pinch off the electric field distribution in the LDD region 908 at the drain side corner of the gate. This novel arrangement eliminates, or at least significantly reduces, the drain potential penetration into the channel region of the device. For a linear MOSFET formed according to one or more embodiments of the invention, the inversion channel operates in a linear mode, without either channel pinch-off or velocity saturation, while the drift (LDD) region 908 of the MOSFET enters into velocity saturation mode. In accordance with one or more embodiments, the MOSFET (e.g., LDMOS transistor 1050 in FIG. 10B) is configured to invoke a full depletion of the LDD transition region close to the channel as the drain potential approaches gate threshold voltage. Thus, as the drain potential continues to rise and eventually exceeds the gate bias, the LDD transition region becomes pinched-off underneath the field plate 1012, and current flow becomes limited by the velocity saturation in the depleted LDD region 908.

As is well known by those skilled in the art, when a strong enough electric field is applied to a semiconductor device, the carrier velocity in the device reaches a maximum value referred to as saturation velocity. When this occurs, the device is said to be in a state of velocity saturation. As the applied electric field increases from this point, the carrier velocity no longer increases because the carriers lose energy through increased levels of interaction with the crystal lattice. Charge carriers normally move at an average drift speed proportional to the electric field strength they experience temporally. The proportionality constant is known as mobility of the carrier, which is a property of the material forming the device. Velocity saturation in the LDD region 908 results in linear $I_{DS}(V_{GS})$ behavior, where $I_{DS}$ does not depend on drain voltage even for $V_{DS}$ values much higher than $V_{GS}$. This behavior can be observed in FIG. 27, where $I_{DS}$ increments are equal for constant $V_{GS}$ steps.

Comparing the two exemplary LDMOS transistor embodiments shown in FIGS. 10A and 10B, LDMOS transistor 1000 shown in FIG. 10A is preferred for applications in which the maximum drain-to-source voltage $V_{DS,max}$ (which may be equivalent to the supply voltage) is in a range of about 12 to 20 volts; the LDMOS transistor 1050 shown in FIG. 10B, having the stepped top field plate configuration (1012, 1014 in FIG.

10B), is optimized for a relatively higher maximum drain voltage $V_{DS,max}$ equal to or above about 30 volts. The difficulty in designing a lateral RF transistor increases as the target supply voltage increases. Consequently, a description of one or more embodiments of the invention herein will focus on 30-volt devices optimized for a 12.5 volt DC supply voltage of the power amplifier.

Figure 26:
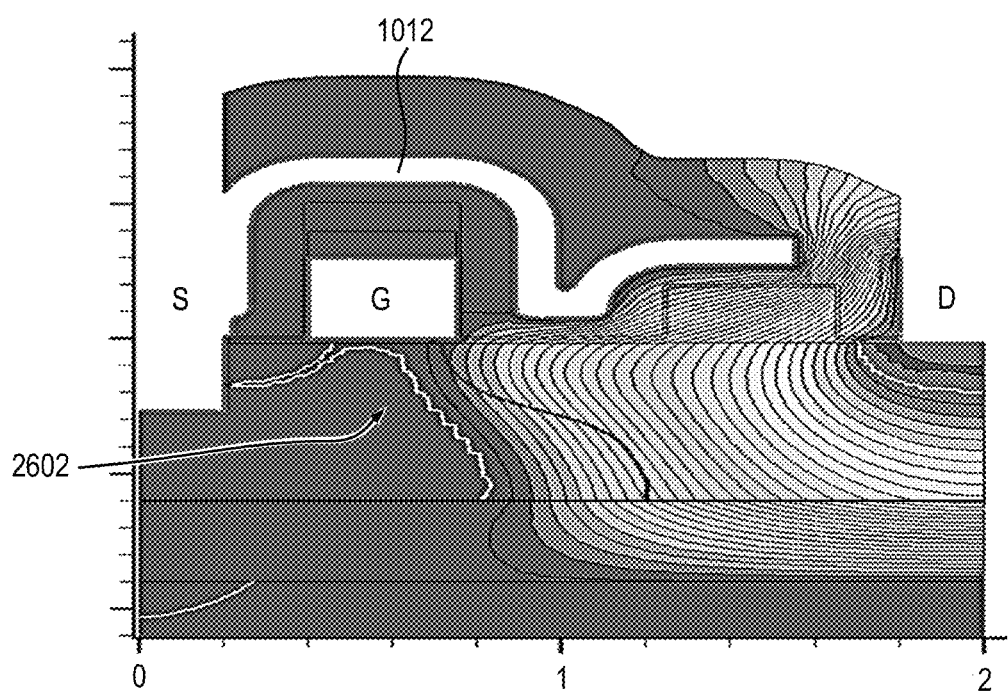
FIG. 26 conceptually depicts an exemplary electric potential distribution between gate and drain regions for the shielding configuration of the LDMOS transistor shown in FIG. 10B, according to an embodiment of the invention.

FIG. 26 illustrates a shielding effect of the MOS channel by the electrostatic impact of the field plate and the deep P extension in the configuration of the LDMOS transistor 1050 as shown in FIG. 10B. More particularly, according to an embodiment of the invention, FIG. 26 depicts an illustrative distribution of the electrostatic potential within the LDMOS transistor 1050. This illustrative result is obtained by numerical simulation of the LDMOS transistor 1050 under reverse bias condition close to breakdown. As apparent from FIG. 26, the drain potential does not penetrate the channel region 2602, an important objective in the design of a linear LDMOS transistor. The resulting linear behavior of the LDMOS transistor 1050 is shown, by way of illustration only, in FIGS. 27 and 28.

Figure 27:
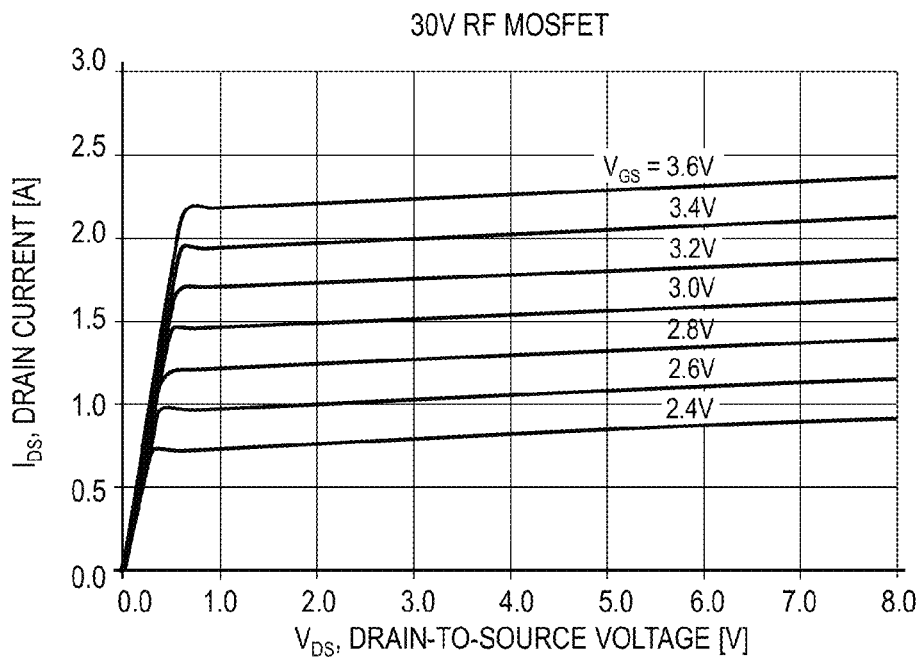
FIG. 27 is a graph depicting drain current as a function of drain-to-source voltage corresponding to the illustrative LDMOS transistor shown in FIG. 10B for exemplary values of gate-to-source voltage.
Figure 28:
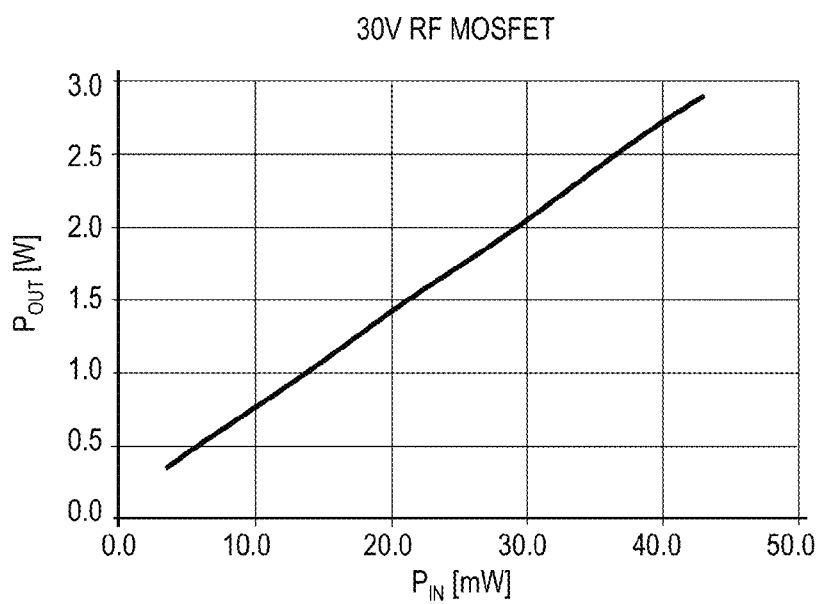
FIG. 28 is a graph depicting exemplary power transfer characteristics for the illustrative LDMOS transistor shown in FIG. 10B.

Specifically, FIG. 27 is a graph depicting drain current, $I_{DS}$, as a function of drain-to-source voltage, $V_{DS}$, corresponding to the exemplary LDMOS transistor 1050 (FIG. 10B) for several values of gate-to-source voltage, $V_{GS}$, ranging from 2.4 volts to 3.6 volts. FIG. 28 is a graph depicting exemplary power transfer characteristics (i.e., output power $P_{OUT}$ as a function of input power $P_{IN}$) for the LDMOS transistor 1050. As apparent from FIG. 28, the degree of linearity of the power transfer characteristics of the LDMOS transistor 1050 is close to ideal to a degree that has not been achievable using conventional RF transistor devices. Consequently, a power amplifier, operative, for example, in a broadband mobile application, employing RF signal amplifying transistors comprising the novel transistor structures according to one or more embodiments of the invention may not require any distortion correction schemes.

Figure 29:
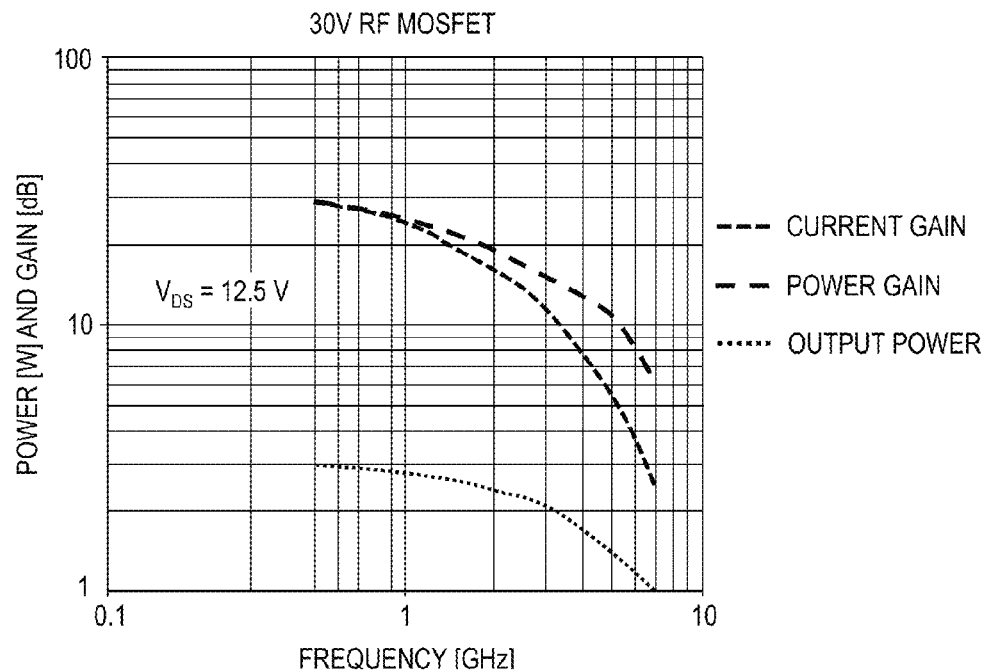
FIG. 29 is a graph depicting calculated power and current gain for the exemplary LDMOS transistor shown in FIG. 10B as a function of frequency, according to an embodiment of the invention.

Calculated power and current gain for the exemplary LDMOS transistor 1050 according to one or more embodiments of the invention are shown in FIG. 29 as a function of carrier frequency. With reference to FIG. 29, the LDMOS transistor 1050 maintains exceptional gain values at least up to about the target frequency for a 2 GHz band. For instance, at a frequency of 2 GHz, the LDMOS transistor 1050 has a power gain of about 19 dB, a current gain of about 17 dB, and an output power of about 2.5 W.

Figure 30:
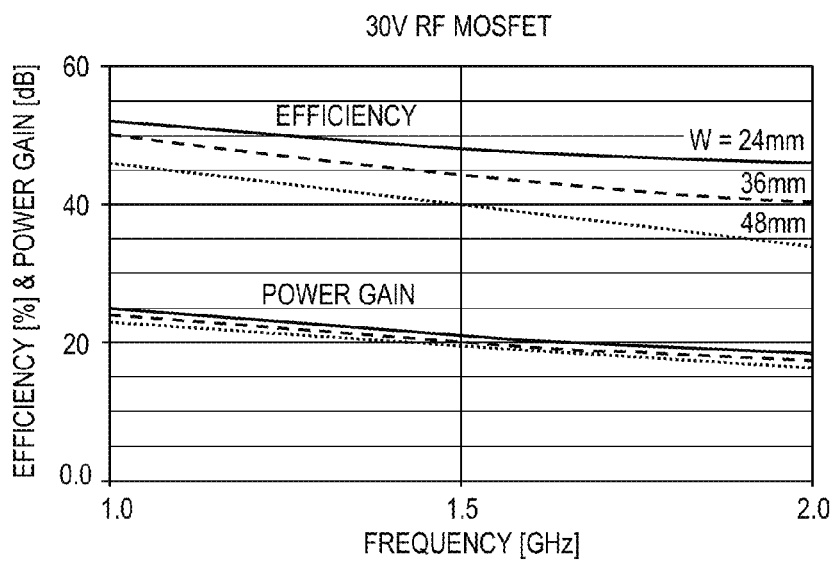
FIG. 30 is a graph conceptually depicting exemplary amplifier efficiency and power gain for the exemplary LDMOS transistor shown in FIG. 10B as a function of frequency, according to an embodiment of the invention.

To evidence further advantages associated with aspects of the invention, power amplifier efficiency has been calculated under the following operating conditions: drain-to-source voltage $V_{DS}$=12.5 volts, output power $P_{OUT}$=3 W at 500 MHz and gate-to-source voltage $V_{GS}$ adjusted to keep the same output power at different frequencies. This calculation has been performed for the exemplary LDMOS transistor 1050 shown in FIG. 10B, and the results are presented in FIG. 30. As apparent from FIG. 30, both the amplifier efficiency and power gain increase with decreasing gate width. This is true primarily because at the frequencies of interest in this example (e.g., about 1-2 GHz), gate capacitance becomes a dominant factor. Thus, since a shorter gate width exhibits reduced capacitance, efficiency and power gain will increase, in spite of an increase in on-resistance $R_{DS,on}$ of the transistor. Illustrative parameters relating to the LDMOS transistor 1050 shown in FIG. 10B are summarized in Table 3 below and are compared with corresponding parameters for a state-of-the-art 50V LDMOS transistor.

TABLE 3

| Parameter | State-of-the-art LDMOS Benchmark | RF LDMOS transistor 1050, according to an embodiment of the invention |
|---|---|---|
| Pitch | Unknown | 2.3 μm |
| Gate width | Unknown | 24 mm |
| $V_{DS,max}$ | 40 V | 30 V |
| $V_{GS,max}$ | 20 V | 12 V |
| $I_{DS,max}$ | 2 A | 2 A |
| VDD | 12.5 V | 12.5 V |
| IDQ | 50 mA | 50 mA |
| $g_m$ (VDD) | Unknown | 0.05 S/mm |
| $C_{iss}$ (VDD) | 33 pF | 16 pF ** |
| $C_{oss}$ (VDD) | 16.5 pF | 6 pF ** |
| $C_{rss}$ (VDD) | 2.2 pF | 0.5 pF ** |
| Drain Efficiency (VDD = 12.5 V, PO = 3 W, f = 500 MHz) | 65% | 54% |
| Power Gain (VDD = 12.5 V, PO = 3 W, f = 500 MHz) | 15 dB | 29 dB |
| Current Gain (VDD = 12.5 V, PO = 3 W, f = 500 MHz) | Unknown | 29.3 dB |

** Includes 30% contribution of CSP assembly

A process flow for fabricating an N-channel RF LDMOS transistor having sufficient linearity to be used in a power amplifier application utilizes essentially the same fabrication steps as those illustrative process steps previously described in conjunction with FIGS. 20A through 20F, which is based on an SOI substrate with a P⁻ handle wafer and an N⁻ active layer. In the context of an exemplary RF power amplifier application, process parameters which are controlled, in accordance with one or more embodiments of the invention, to configure the LDMOS transistor for achieving a higher degree of linearity include, but are not limited to: (i) doping of the LDD and deep well regions (e.g., 908 and 902, respectively, in FIG. 10B) in the vicinity of the drain side corner of the gate which is configured to satisfy prescribed charge balance criteria in conjunction with the impact of the field plate on the top surface of the device; and (ii) a bottom thickness of a spacer along the side wall of the gate, and the thickness of the field plate oxide (e.g., 1016 in FIG. 10B) which define an effectiveness of the field plate action in the device.

With regard to doping of the LDD and deep well regions in the vicinity of the drain side corner of the gate, a preferred LDD doping is achieved, according to one or more embodiments, by a double phosphor implant with a first dose of about 1e12 atoms/cm² to about 3e12 atoms/cm² and an energy of about 50 keV, and a second dose of about 3e12 atoms/cm² to about 6e12 atoms/cm² and an energy of about 170 keV; in a combination where the total charge density remains between about 4e12 and 8e12 atoms/cm². The deep P-well is preferably created by a boron implant with a dose of about 2e13 atoms/cm² and an energy of about 180 keV. With regard to the spacer along the sidewall of the gate, a thickness of the spacer is configured to be between about 600 Å and 800 Å. The field plate oxide is preferably configured having a thickness of between about 800 Å and 1200 Å.

Taking advantage of the BiCMOS technology used to form an RF transistor (e.g., RF switch, PA, etc.) according to one or more embodiments of the invention described herein, a silicon die comprising the novel RF transistor can be configured to integrate related circuitry, such as, for example, passive components to connect matching filters, etc., to the terminals of the RF transistor. Moreover, some circuitry can be monolithically integrated to perform signal processing prior to amplification. By way of example only and without limitation, the ability of the BiCMOS technology according to aspects of the invention to integrate a high-efficiency DC-DC converter, among other circuitry, provide an opportunity to fabricate a complete power amplifier module on one die.

Figure 31:
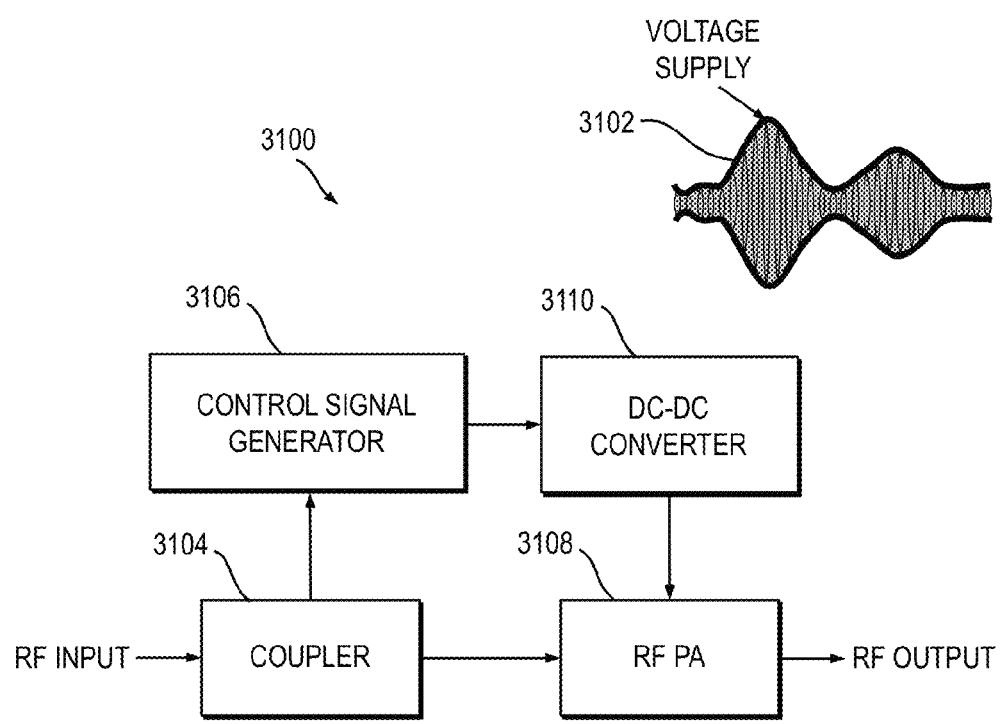
FIG. 31 is a block diagram conceptually depicting a PA system configured to perform envelope tracking which is integrated on a single SOI die, according to an embodiment of the invention.

More particularly, FIG. 31 is a block diagram conceptually depicting a power amplifier (PA) system 3100 configured to perform envelope tracking, according to an embodiment of the invention. Envelope tracking is a power supply technique for enhancing the energy efficiency of RF PAs. In principle, in an envelope tracking methodology, the standard fixed voltage supply operative to supply power to the RF PA is replaced with a dynamic voltage supply which closely monitors an amplitude, or envelope 3102, of a transmitted RF signal and controls a level of the supply voltage as a function of the monitored envelope. Traditional RF PAs are supplied with a fixed DC voltage, but are only energy efficient when they are in compression (at the peaks of the transmitted waveform). Most often, the supply voltage is higher than required, and the excess power is dissipated as heat in the PA system.

With reference to FIG. 31, the PA system 3100 comprises a coupler 3104 operative to receive an RF input signal. The coupler 3104 is operative to split the RF input signal into multiple signals representative thereof; in essence, the coupler creates copies of the RF input signal for use by multiple corresponding functional blocks. A first copy of the RF input signal is supplied to a control signal generator 3106 and a second copy of the RF input signal is supplied to a power amplifier (PA) 3108. The control signal generator 3106 is operative to monitor the envelope 3102 of the RF input signal (i.e., the transmitted RF signal) and to generate a control signal which is supplied to a DC-DC converter 3110. The DC-DC converter 3110 is operative to generate an output voltage having a level which changes dynamically as a function of the control signal received from the control signal generator 3106. This output voltage is supplied to the PA 3108 for dynamically adjusting the supply voltage of the PA as a function of the envelope 3102 of the transmitted RF signal. This optimizes energy efficiency in the PA system 3100 by keeping the PA 3108 operating close to compression over the entire modulation cycle, instead of just at the peaks of the transmitted RF signal.

Thus, in accordance with one or more embodiments of the invention, an LDMOS transistor is configured for use in an RF power application. Among certain benefits achieved by the novel RF transistor include one or more of the following:

The RF MOSFET has the lateral LDMOS structure formed in accordance with the teachings herein fabricated within a thin silicon active layer on an upper surface of a buried oxide layer in an SOI substrate. The device structure comprises a deep P-well located along the interface with he buried oxide which is used to pin (i.e., control) a location of the avalanche breakdown between the tip of the P-well and the drain contact, as previously described. By uniquely configuring the transition region between the MOS channel and the lightly doped drift (LDD) region in a manner which prevents a drain potential from penetrating the MOS channel region. This solution effectively decouples the electric field within the inversion MOS channel from the electric field in the drift region LDD, thereby providing an LDMOS transistor which exhibits enhanced linearity, and is therefore well-suited for use in an RF amplifier application.

A careful design of the transition region between the MOSFET channel and the LDD region assures depletion and pinch-off of the LDD region in the vicinity of the drain side corner of the gate as the applied increasing drain bias reaches gate voltage. This is achieved, according to one or more embodiments of the invention, by the electrostatic impact of the deep P-well and the field plate structure above the LDD region on the electric field distribution with the LDD region.

During conduction under high positive drain bias, the inversion MOS channel operates in a linear mode whereas current flow through the depleted LDD region is limited by velocity saturation of charge carriers (e.g., electrons).

Preservation of the linear mode of operation of the inversion MOS channel under all operating conditions (i.e., essentially all combinations of applied gate and drain voltages, $V_{GS}$ and $V_{DS}$, respectively) results in linear, or near-linear, power transfer characteristics.

Design of the RF MOSFET in a BiCMOS technology facilitates an integration of passive (and other) components to realize, for example, matching filters or other circuitry, monolithic integration of signal processing circuitry, and integration of a high-efficiency switching DC-DC converter on the same chip. Accordingly, aspects of the invention provide an opportunity to design fully integrated PA modules on a single silicon die.

Having all electric terminals on the top surface of the die, it is possible to flip the die and exploit advantages of CSP assembly technology.

At least a portion of the embodiments of the invention may be implemented in an integrated circuit. In forming integrated circuits, identical die are typically fabricated in a repeated pattern on a surface of a semiconductor wafer. Each die includes at least one device described herein, and may include other structures and/or circuits. The individual die are cut or diced from the wafer, then packaged as an integrated circuit. One skilled in the art would know how to dice wafers and package die to produce integrated circuits. Integrated circuits so manufactured are considered part of this invention.

An integrated circuit in accordance with embodiments of the invention can be employed in essentially any application and/or electronic system in which power management techniques may be employed. Suitable applications and systems for implementing techniques according to embodiments of the invention may include, but are not limited to, portable devices, including smart phones, laptop and tablet computing devices, netbooks, etc. Systems incorporating such integrated circuits are considered part of embodiments of the invention. Given the teachings of embodiments of the invention provided herein, one of ordinary skill in the art will be able to contemplate other implementations and applications of the techniques of embodiments of the invention.

The illustrations of embodiments of the invention described herein are intended to provide a general understanding of the structure of various embodiments, and they are not intended to serve as a complete description of all the elements and features of apparatus and systems that might make use of the structures described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the inventive subject matter are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

The abstract is provided to comply with 37 C.F.R. §1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description of Preferred Embodiments, it can be seen that various features are grouped together in a single embodiment for the purpose of streamlining the disclosure. This method of disclosure is not to be interpreted as reflecting an intention that the claimed embodiments require more features than are expressly recited in each claim.

Given the teachings of embodiments of the invention provided herein, one of ordinary skill in the art will be able to contemplate other implementations and applications of the techniques of embodiments of the invention. Although illustrative embodiments of the invention have been described herein with reference to the accompanying drawings, it is to be understood that embodiments of the invention are not limited to those precise embodiments, and that various other changes and modifications are made therein by one skilled in the art without departing from the scope of the invention.

What is claimed is:

1. A semiconductor structure comprising at least one radio frequency (RF) metal-oxide-semiconductor (MOS) transistor, the at least one RF MOS transistor comprising:
   a first insulating layer formed on a substrate;
   an active region having a first conductivity type formed on at least a portion of the first insulating layer;
   a buried well having a second conductivity type formed in the active region;
   a source region having the first conductivity type formed in the active region proximate an upper surface of the active region, the source region being electrically connected with the buried well;
   a drain region having the first conductivity type formed in the active region proximate the upper surface of the active region and spaced laterally from the source region and the buried well;
   a body region having the second conductivity type formed in the active region between the source and drain regions on at least a portion of the buried well, at least a portion of the source region extending laterally into the body region;
   a drift region having the first conductivity type formed in the active region between the drain and body regions on at least a portion of the buried well;
   a gate formed above the active region proximate the upper surface of the active region and at least partially between the source and drain regions; and
   a shielding structure formed proximate the upper surface of the active region, the shielding structure being spaced laterally from the gate and overlapping at least a portion of the gate, the shielding structure being electrically connected at one end to the source region;
   wherein the at least one RF MOS transistor is configured such that during conduction under a potential applied to the drain region, the buried well forms a PN junction with the drift region which, in conjunction with the shielding structure, depletes at least a portion of the drift region between the shielding structure and the buried well, and wherein the transistor is configured to induce a velocity saturation mode of operation in the depleted drift region when the potential applied to the drain region is larger than an applied gate bias to thereby sustain a linear mode of operation of an inversion channel formed under the gate for all operating conditions of the transistor.

2. The semiconductor structure of claim 1, wherein during conduction of the at least one RF MOS transistor under the potential applied to the drain region, the transistor is configured such that the buried well, in conjunction with the shielding structure, depletes a portion of the drift region under the shielding structure and current flow through the depleted drift region is limited by velocity saturation of carriers in the transistor.

3. The semiconductor structure of claim 1, wherein the buried well, drift region, and the contour of the shielding structure in the at least one RF MOS transistor are configured such that a net charge associated with the drift region is substantially balanced with a net charge associated with the buried well.

4. The semiconductor structure of claim 1, wherein the drift region in the at least one RF MOS transistor is configured to prevent a potential applied to the drain region from penetrating into a channel region formed in the body region under an applied gate potential to thereby substantially eliminate a drain current dependence on the potential applied to the drain region and to sustain a long-channel operation of the transistor with a linear relationship between drain current and gate-to-source voltage for a drain bias larger than a gate-to-source voltage of the transistor.

5. The semiconductor structure of claim 1, wherein the buried well in the at least one RF MOS transistor is configured to form a PN clamping diode operative to position a breakdown avalanche region between the buried well and the drain region, a breakdown voltage of the transistor being a function of one or more characteristics of the buried well.

6. The semiconductor structure of claim 1, further comprising a plurality of trench structures formed substantially vertically through the active region and into the buried well, each of the trenches including sidewalls and a bottom wall having an insulating material formed thereon, each of the trenches being filled with a conductive material, wherein a voltage applied to at least one of the plurality of trenches is operative to modulate a conduction current which flows between at least two of the trenches, an amplitude of the conduction current being controlled as a function of the applied voltage.

7. The semiconductor structure of claim 6, wherein at least a subset of the plurality of trenches is operative to one of deplete and enhance a gate/body interface formed in the semiconductor structure to thereby control a current flow through an inversion channel formed in the MOS transistor.

8. The semiconductor structure of claim 6, wherein at least a subset of the trenches are connected with the gate, and wherein a voltage applied to the gate is operative to generate a conduction current which flows between at least two of the trenches, an amplitude of the conduction current being controlled as a function of the applied gate voltage.

9. The semiconductor structure of claim 1, wherein the shielding structure is configured to extend an electric field distribution along a top oxide interface of the at least one RF MOS transistor away from an edge of the gate nearest the drain region.

10. The semiconductor structure of claim 1, wherein the buried well is formed proximate an interface between the first insulating layer and the active region.

11. The semiconductor structure of claim 1, further comprising control circuitry integrated with the at least one RF MOS transistor on the substrate, the control circuitry being configured to selectively control an operation of the at least one RF MOS transistor.

12. The semiconductor structure of claim 11, wherein the control circuitry comprises a DC-DC converter configured to provide a supply voltage to the RF MOS transistor.

13. The semiconductor structure of claim 12, further comprising a power amplifier including the at least one RF MOS transistor, wherein the control circuitry is configured to detect an amplitude of an input signal supplied to the power amplifier and the DC-DC converter is configured to control a level of the supply voltage to the RF MOS transistor as a function of the detected amplitude of an input signal.

14. The semiconductor structure of claim 1, wherein the drift region in the at least one RF MOS transistor is configured having a maximum doping concentration of between about 1e17 atoms/cm$^3$ and 4e17 atoms/cm$^3$, and having a depth of between about 0.2 µm and 0.4 µm.

15. The semiconductor structure of claim 1, wherein a spacer width at the gate side wall in the at least one RF MOS transistor is configured to be between about 600 Å and 800 Å.

16. The semiconductor structure of claim 1, wherein the at least one RF MOS transistor is configured having a thickness of oxide underneath the shielding structure of between about 800 Å and 1200 Å.

17. The semiconductor structure of claim 1, wherein the at least one RF MOS transistor is configured having an extension of the buried well beyond an edge of the gate nearest the drain region of between about 0.1 µm and 0.2 µm.

18. The semiconductor structure of claim 1, wherein the buried well in the at least one RF MOS transistor is configured such that a sheet charge in the buried well has a value larger than a sheet charge in the drift region.

19. The semiconductor structure of claim 1, wherein the buried well, drift region, and a contour of the shielding structure in the at least one RF MOS transistor are configured such that a net charge associated with the drift region is balanced with a net charge associated with the buried well.

20. The semiconductor structure of claim 1, wherein the drift region in the at least one RF MOS transistor is configured to have a doping level achieved using a double phosphor implant with a first dose of about 1e12 atoms/cm$^2$ to about 3e12 atoms/cm$^2$ and an energy of about 50 keV, and a second dose of about 3e12 atoms/cm$^2$ to about 6e12 atoms/cm$^2$ and an energy of about 170 keV.

21. A method of forming an RF MOS transistor adaptable for integration with other components on a common substrate, the method comprising:
   forming a first insulating layer on a substrate;
   forming an active region having a first conductivity type on at least a portion of the first insulating layer;
   forming a buried well having a second conductivity type in the active region;
   forming a source region having the first conductivity type in the active region proximate an upper surface of the active region, the source region being electrically connected with the buried well;
   forming a drain region having the first conductivity type in the active region proximate the upper surface of the active region and spaced laterally from the source region and the buried well;
   forming a body region having the second conductivity type in the active region between the source and drain regions on at least a portion of the buried well, at least a portion of the source region extending laterally into the body region;
   forming a drift region having the first conductivity type in the active region between the drain and body regions on at least a portion of the buried well;
   forming a gate above the active region proximate the upper surface of the active region and at least partially between the source and drain regions;
   forming a shielding structure proximate the upper surface of the active region, the shielding structure being spaced laterally from the gate and overlapping at least a portion of the gate, the shielding structure being electrically connected at one end to the source region; and
   configuring the RF MOS transistor such that during conduction under a potential applied to the drain region, the buried well forms a PN junction with the drift region which, in conjunction with the shielding structure, depletes at least a portion of the drift region between the shielding structure and the buried well, wherein the transistor is configured to induce a velocity saturation mode of operation in the depleted drift region when the potential applied to the drain region is larger than an applied gate bias to thereby sustain a linear mode of operation of an inversion channel formed under the gate for all operating conditions of the transistor.

\* \* \* \* \*